(12) United States Patent
Carter

(10) Patent No.: US 7,252,718 B2
(45) Date of Patent: Aug. 7, 2007

(54) FORMING A PASSIVATING ALUMINUM FLUORIDE LAYER AND REMOVING SAME FOR USE IN SEMICONDUCTOR MANUFACTURE

(75) Inventor: Melvin K. Carter, Los Gatos, CA (US)

(73) Assignee: EKC Technology, Inc., Barrington, CA (US)

( * ) Notice: Subject to any disclaimer, the term of this patent is extended or adjusted under 35 U.S.C. 154(b) by 587 days.

(21) Appl. No.: 10/448,127

(22) Filed: Aug. 27, 2003

(65) Prior Publication Data
US 2006/0000492 A1    Jan. 5, 2006

Related U.S. Application Data

(60) Provisional application No. 60/384,142, filed on May 31, 2002.

(51) Int. Cl.
*B08B 3/04* (2006.01)

(52) U.S. Cl. ............... 134/26; 134/2; 134/28; 134/40; 134/41; 134/42

(58) Field of Classification Search ............... 134/26, 134/2, 28, 40, 41, 42
See application file for complete search history.

(56) References Cited

U.S. PATENT DOCUMENTS

| | | |
|---|---|---|
| 5,129,955 A | 7/1992 | Tanaka |
| 5,181,985 A | 1/1993 | Lampert et al. |
| 5,545,289 A * | 8/1996 | Chen et al. ............... 438/694 |
| 5,560,857 A | 10/1996 | Sakon et al. |
| 5,563,119 A | 10/1996 | Ward |
| 5,571,447 A | 11/1996 | Ward et al. |
| 5,603,849 A | 2/1997 | Li |
| 5,630,904 A | 5/1997 | Aoyama et al. |
| 5,645,737 A | 7/1997 | Robinson et al. |

(Continued)

FOREIGN PATENT DOCUMENTS

EP    0 662 705 A2    7/1995

OTHER PUBLICATIONS

Ireland, P., *Thin Solid Films*, 304, pp. 1-12 (1997).

(Continued)

*Primary Examiner*—Sharidan Carrillo
(74) *Attorney, Agent, or Firm*—Morgan Lewis & Bockius LLP

(57) ABSTRACT

A composition for the cleaning of residues from substrates can contain from about 0.01 percent by weight to about 5 percent by weight of one or more fluoride compounds, from about 20 percent by weight to about 50 percent by weight water, from about 20 percent by weight to about 80 percent by weight of an organic amide solvent and from 0 to about 50 weight percent of an organic sulfoxide solvent. The composition can have a pH between about 7 and about 10, alternately from greater than 8 to about 10. Additionally, the composition optionally can contain corrosion inhibitors, chelating agents, surfactants, acids, and/or bases. In use of the composition, a substrate can advantageously be contacted with the composition for a time and at a temperature that permits cleaning of the substrate.

14 Claims, 12 Drawing Sheets

U.S. PATENT DOCUMENTS

| | | | |
|---|---|---|---|
| 5,672,577 | A | 9/1997 | Lee |
| 5,705,089 | A | 1/1998 | Sugihara et al. |
| 5,709,756 | A | 1/1998 | Ward et al. |
| 5,962,385 | A * | 10/1999 | Maruyama et al. ......... 510/176 |
| 5,972,862 | A * | 10/1999 | Torii et al. .................. 510/175 |
| 6,235,693 | B1 * | 5/2001 | Cheng et al. ............... 510/175 |
| 6,248,704 | B1 | 6/2001 | Small et al. |
| 6,323,169 | B1 * | 11/2001 | Abe et al. ................... 510/176 |
| 6,478,035 | B1 * | 11/2002 | Niuya et al. ............... 134/95.2 |
| 6,703,319 | B1 * | 3/2004 | Yates et al. ................. 438/745 |
| 2001/0050350 | A1 * | 12/2001 | Wojtczak et al. .......... 252/175 |
| 2002/0037820 | A1 * | 3/2002 | Small et al. ................ 510/175 |
| 2003/0078173 | A1 * | 4/2003 | Wojtczak et al. .......... 510/175 |

OTHER PUBLICATIONS

K. Ueno et al., "Cleaning of $CHF_3$ Plasma-Etched $SiO_2$/SiN/Cu Via Structures with Dilute Hydrofluoric Acid Solutions," *J. Electrochem. Soc.*, vol. 144, (7) 1997.

Lee, C. and Lee, 5, Effects of Plasma Treatments on the Erosion of Teos-BPSG Films by Chemical Etchants, *Solid State Electronics*, 4, pp. 921-923 (1997).

Taylor, D., "Wet-etch Process Improvements Through SPC" *Solid State Technology*, Jul. 1998, p. 119.

Singer, P. "Wafer Cleaning: Making the Transition to Surface Engineering", *Semi International*, p. 88, Oct. 1995.

Ohman et al., "Equilibrium and Structural Studies of Silicon(IV) and Aluminium(III) in Aqueous Solution . . . ". *J. Chem. Soc., Dalton Trans.* (1983), p. 2513.

Kujime, T. et al., "The Cleaning of Particles From Si Wafer Surface by Fluorine Soution Excited by Megasonic", Proc. of the 1996 Semi. Pure Water and Chemicals, pp. 245-256.

Rafols, C.et al., "Ionic Equilibria in Aqueous Organic Solvent Mixtures . . . ", *J. Electroanalytic Chem.* 433, pp. 77-83, 1997.

Baklanov, M.R. et al., *Proc. Electrochem. Soc.*, 1998, 97-35, pp. 602-609.

Conf. On Solid State Devices and Materials, 1991, pp. 484-486.

* cited by examiner

FORMING A PASSIVATING ALUMINUM FLUORIDE LAYER AND REMOVING SAME FOR USE IN SEMICONDUCTOR MANUFACTURE

CROSS-REFERENCE TO RELATED APPLICATIONS

This application claims benefit to Provisional Application No. 60/384,142, filed May 31, 2002.

FIELD OF THE INVENTION

This invention relates to a process using semiaqueous cleaning composition that is particularly useful for cleaning organic and inorganic compounds or "polymers" (post etch residues) from a semiconductor substrate. As used herein, the term "semiaqueous" refers to a mixture of water and organic solvent. The invention also includes compositions used to treat and to clean residues from semiconductor substrates. The solutions contain fluoride compounds, water, and solvent and optionally contain corrosion inhibitors, chelating agents, surfactants, acids and bases.

BACKGROUND OF THE INVENTION

Fluoride containing chemistries have been used for many years to clean prime silicon wafers (wafers that have not yet undergone ion implantation or device construction) in the semiconductor industry. Normally, the fluoride chemistry (usually dilute hydrofluoric acid) is used as the last process step in the sequence called "RCA rinses". The substrate is often contaminated from previous process steps with monolayer amounts of metal, anions and/or organic contaminants or surface residues (particles). These contaminants have been shown to have significant impact on the electrical integrity of simple test device structures and they need to be efficiently cleaned without impairing their integrity. Such cleaning methods could include techniques discussed in the technical literature, for example, mt. Conf. On Solid State Devices and Materials, 1991, pp. 484-486 or Kujime, T. et al., Proc. of the 1996 Semi. Pure Water and Chemicals, pp. 245-256 and Singer, P. *Semi International*, p. 88, October 1995.

Patents that teach methods for cleaning prime wafers with low pH solutions include U.S. Pat. Nos. 5,560,857; 5,645,737; 5,181,985; 5,603,849; and 5,705,089.

Using fluoride chemistries (usually HF) as a final RCA cleaning step will cause the silicon wafer surface to be in a hydrophobic state (the surface is covered with Si-H groups) which will repel water. During this cleaning step a certain proportion of the wafer surface is dissolved (removed). Unless the cleaning conditions are carefully monitored (time, temperature, solution composition) the substrates can be damaged, as reported by Rafols, C. et al., *J. Electroanalytic Chem.* 433, pp. 77-83, 1997. Numerous compositions combine water and organic solvents. The water concentration in these HF solutions is very critical. Silica oxide has an etch rate of 21 Å/min (@25° C.) in HF/water, but in isobutanol the rate was reduced to 2.14 Å/min and even lower in acetone (an aprotic solvent) the rate was only 0.12 Å/min.

After the Front End of Line (FEOL) cleaning process the wafer proceeds to the typical Back End of Line (BEOL) manufacturing process for a semiconductor devices, in which the devices might be dynamic random access memories (DRAMs), static random access memories (SRAMs), logic, electrically programmable read only memories (EPROMs), complementary metal on silicon (CMOS), and the like. Etching fabrication technology using chemical reactions (liquid or plasma) has been used as a method of forming a wiring structure on such semiconductor substrates.

A photoresist film is deposited on the wafer to form a mask, then a substrate design is imaged on the film layer, baked, and the undeveloped image is removed with a photoresist cleaner. The remaining image is then transferred to the underlying material (either a dielectric or metal) with reactive etching gases promoted with plasma energy. The etchant gases selectively attack the unprotected area of the substrate. Liquid etching chemistries, usually containing fluoride chemistries have been used extensively over the years to etch metals (Al) and dielectrics. The fluoride chemistries can be very aggressive and can result in isotropic etching (etching equally in all directions). Isotropic etching effects cannot be tolerated with today's needs for tight critical dimension control, though there have been attempts to control the isotropic etch through statistical process control techniques, as reported by Taylor, D., *Solid State Technology*, July 1998, p. 119.

The usual plasma etching process involves anisotropic (unidirectional) etching while at the same time the byproducts (e.g., composed of photoresist, etching gasses and etched materials) are deposited on the sidewall of etched openings as residues.

A disadvantage of forming this protective sidewall deposit is that it can be very difficult to remove the residue after the etching procedure. If the components in these residues are not removed or neutralized in some manner then the residues will absorb moisture and form acidic species that can corrode the metal structures. The resultant acid corrodes wiring materials to bring about an adverse effect such as an increase in electrical resistance and wire disconnection.

Such problems frequently occur, in particular in aluminum and aluminum alloys generally used as wiring material. The wafer substrate in contact with acidic materials, if not controlled, can destroy the metal structures.

Following completion of the etching operation it is necessary that the resist mask be removed from the protective surface to permit finishing operations. It is desirable to develop an improved cleaning composition to remove the organic polymeric substance from a coated inorganic substrate without corroding, dissolving or dulling the metal circuitry or chemically altering the wafer substrate.

Cleaning compositions used for removing photoresist coatings if not already ashed and other substrates have for the most part been highly flammable, generally hazardous to both humans and the environment, and comprise reactive solvent mixtures exhibiting an undesirable degree of toxicity. Moreover, these cleaning compositions are not only toxic, but their disposal is costly since they might have to be disposed of as a hazardous waste. In addition, these compositions generally have severely limited bath life and, for the most part, are not recyclable or reusable.

Side wall residues have been removed with either acidic organic solvents or alkaline organic solvents. The acidic solvents are generally composed of phenolic compounds or chlorinated solvents and/or an aromatic hydrocarbon and/or an alkylbenzenesulfonic acid. These formulations generally need to be used at temperatures up to and beyond 100° C. These chemistries normally need to be rinsed with isopropanol.

Dilute hydrofluoric acid solutions can under certain conditions remove the sidewall polymers by aggressively attacking the via sidewall of the dielectric and therefore changing the dimensions of the device, as taught by Ireland, P., *Thin Solid Films*, 304, pp. 1-12 (1997), and possibly the dielectric constant. Previous chemistries that contain HF, nitric acid, water, and hydroxylamine are aggressive enough to etch silicon, as taught by U.S. Pat. No. 3,592,773 issued to A. Muller. Recent information also indicates that the dilute HF solutions can be ineffective for cleaning the newer fluorinated hydrocarbon etch residues, as taught by K. Ueno et al., "Cleaning of $CHF_3$ Plasma-Etched $SiO_2$/SiN/Cu Via Structures with Dilute Hydrofluoric Acid Solutions," *J. Electrochem. Soc.*, vol. 144, (7) 1997. Contact holes opened on to the $TiSi_2$ have also been difficult to clean with HF solutions since there appears to be an attack of the underlying $TiSi_2$ layer. There may also be difficulty with mass transport of the chemicals in the narrow hydrophilic contact holes, as taught by Baklanov, M. R. et al., *Proc. Electrochem. Soc.*, 1998, 97-35, pp. 602-609.

The photoresist around the contact hole of common interlayer dielectrics, TEOS (tetraethylorthosilicate) and boron phosphosilicate glass (BPSG), which are commonly used in ultra large scale integration (ULSI) structures for better conformity of step coverage, is usually removed with HF solutions. It is not uncommon for the HF to also attack the dielectric material. Such attack is not desirable (see Lee, C. and Lee, 5, *Solid State Electronics*, 4, pp. 921-923 (1997)).

The alkaline organic solvents for post etch residue removal can be composed of amines and/or alkanolamines and/or neutral organic solvents. These formulations generally must be used at temperatures above 100° C. Recently a new class of post etch residue cleaning chemistries has been used to clean these substrates. These chemistries include hydroxylamine, amines, alkanolamines and corrosion inhibitors and generally operate at temperatures of at least 20 to 30 degrees lower.

Recently, fluoride-based chemistries have been used in limited cases to remove post etch residues and to a limited extent, photoresist residues from integrated circuit substrates during BEOL (Back End of Line) processes. Many of the wafer cleaning compositions contain fluoride components, specifically hydrogen fluoride. In addition, these compositions might contain strong caustic chemicals (choline-derivatives, tetraalkyl-ammonium hydroxide, or ammonium hydroxide) such as disclosed in U.S. Pat. Nos. 5,129,955; 5,563,119; or 5,571,447 (the disclosures of which are incorporated by reference), or might use a two-phase solvent system, which contains one phase with hydrofluoric acid and water while a second phase contains a nonpolar organic solvent (ketones, ethers, alkanes or alkenes; U.S. Pat. No. 5,603,849, the disclosure of which is hereby incorporated by reference hereto). Other formulations include hydroxylamine and ammonium fluoride (U.S. Pat. No. 5,709,756, issued to Ward, the disclosure of which is hereby incorporated by reference hereto). Additional examples include quaternary ammonium salt and fluoride based compositions, as disclosed in published European Application No. 0662705, and organocarboxylic ammonium salt or amine carboxylate and fluoride-based compositions, as disclosed in U.S. Pat. No. 5,630,904, the disclosure of which is hereby incorporated by reference hereto.

Some chemistries have also included chelating agents to help remove ionic and anionic contamination from the wafer surface (International Publication No. PCT/US98/02794), but chelating agents such as citric acid, gallic acid, and catechol, among others, can be aggressive toward the aluminum oxide that covers the Al metal lines. Studies by Ohman and Sjoberg show that the strong complexing ability of citric ions can increase the aluminum oxide solubility and thereby expose the metal to further corrosion, by factors of 166 and 468 at pH 5 and 6 (see Ohman et al., *J. Chem. Soc., Dalton Trans*. (1983), p. 2513).

Other methods for cleaning metal and metal oxide residues on wafers include spraying water vapor into the plasma ashing chamber followed by introducing fluorine containing gases (hydrofluoric acid; U.S. Pat. No. 5,181,985, the disclosure of which is hereby incorporated by reference hereto) or a liquid containing hydrofluoric acid, ammonium fluoride and water with a pH from 1.5 to less than 7.

One method employing a fluoride-based chemistry is commonly assigned U.S. Pat. No. 6,248,704, the disclosure and figures of which are hereby incorporated by reference hereto for all purposes.

There is also a need to remove particulate residues from the wafer surfaces during the BEOL process. Currently most processes rely on an isopropanol and/or deionized water rinse with/or without ultra- or mega-sonic cleaning. For post chemical mechanical polishing (CMP) cleaning of oxide wafers, normally only deionized water is used, but with tungsten wafers a combination of dilute $NH_4OH$ and dilute HF usually are required.

There are five potential mechanisms for removing impurities (particles and/or ions) from the wafer surfaces:

1. Physical desorption by solvents, which involves replacing a small number of strongly absorbed particles with a large volume of weakly adsorbed solvent (changing the interaction of the surface charges);
2. Changing the surface charge with either acids or bases, e.g., making the Si—OH group positive, protonating with acid, or making the group negative with bases by removing the proton;
3. Ion complexation by removing adsorbed metal ions by adding acid (e.g., ion exchange);
4. Oxidation or decomposition of impurities, which involves oxidation of metals, organic materials or the surface of slurry particles, which changes the chemical forces between the impurities and substrate surface (the chemical reaction can either be through redox chemistry or free radicals); or
5. Etching the oxide surface, which releases the impurity while dissolving a certain thickness of the substrate surface.

Currently available fluoride-based chemistries can help in items #2 and #5, but the cleaning conditions must be carefully controlled. In many cases, the components of the cleaning compositions are relatively toxic reactive solvent mixtures and thus must be subject to stringent use conditions and require hazardous chemical handling procedures and wearing of safety garments and apparel by users so as to avoid contact with the cleaning compositions. Additionally, because many of the toxic components of such cleaning compositions are highly volatile and subject to high evaporation rates, they require special human and environmental safety precautions to be taken during storage and use of the compositions.

Accordingly, there exists a need to develop improved cleaning compositions to efficiently clean a variety of deposits from a wide variety of substrates. Particularly in the field of integrated circuit fabrication, it should be recognized that the demands for improved cleaning performance with avoidance of attack on the substrates being cleaned are constantly increasing. This means that compositions that were suitable for cleaning less sophisticated integrated circuit substrates may not be able to produce satisfactory results with substrates containing more advanced integrated circuits in the process of fabrication.

These compositions should also be economical, environmental friendly and easy to use.

The present invention teaches such a new and improved cleaning composition and a process for its use. This composition is aqueous, dissolves both organic and inorganic substances, and, when used in the process, is able to clean a variety of substrates. The composition provides a more effective cleaning of the substrates, which means more effective residue removal, which in turn means that higher product yields can be obtained from the substrates being cleaned.

SUMMARY OF THE INVENTION

The invention includes a composition that can be used to form a passivating layer over, for example, an aluminum, substrate. In one embodiment, metal surface de-fluorinating agent formulations according to the invention can advantageously include less than about 30% water, alternately not more than about 50% water, for example not more than about 70% water. The metal surface de-fluorinating agent formulations according to the invention may include not less than about 5% water, alternately not less than about 10% water, for example not less than about 15% water. In one embodiment, the metal surface de-fluorinating agent formulations can contain from about 5% to about 70% water. In another embodiment, metal surface de-fluorinating agent formulations according to the invention may contain substantially no water. As used herein, the phrase "contain(s) substantially no," in reference to a composition or to a specific element of a composition, unless otherwise defined, should be understood to mean that the composition contains less than about 2%, preferably less than about 1%, more preferably less than about 0.1%, most preferably less than about 0.01%, of the specific element mention thereafter. Preferably, when the aforementioned phrase is used, the composition is completely free of any added element specifically mentioned thereafter.

In this embodiment, metal surface de-fluorinating agent formulations according to the invention advantageously includes more than about 30% organic solvent, alternately not less than about 50% organic solvent, for example not less than about 70% organic solvent or about 70% to about 95% organic solvent. In another embodiment, metal surface de-fluorinating agent formulations according to the invention may include less than about 95% organic solvent, alternately less than about 85% organic solvent, for example less than about 75% organic solvent.

The invention also includes compositions that can be used to remove a fluoride layer, e.g., an aluminum fluoride layer, from an aluminum substrate. In one embodiment, metal surface fluorinating agent formulations according to the invention can advantageously include not more than about 70% organic solvent, alternately not more than about 50% organic solvent, for example not more than about 30% organic solvent or about 5% to about 30% organic solvent. In another embodiment, metal surface fluorinating agent formulations according to the invention may include not less than about 5% organic solvent, alternately not less than about 10% organic solvent, for example not less than about 15% organic solvent. In another embodiment, metal surface fluorinating agent formulations according to the invention may contain substantially no organic solvent.

In this embodiment, metal surface fluorinating agent formulations according to the invention can advantageously include not less than about 30% water, alternately not less than about 50% water, for example not less than about 70% water. In another embodiment, metal surface fluorinating agent formulations according to the invention may include less than about 95% water, alternately less than about 85% water, for example less than about 75% water.

In use of the composition, a substrate can advantageously be contacted with the composition for a time and at a temperature that permits cleaning of the substrate. The surface of an aluminum metal layer (existing either as pure metal or with a thin oxide layer thereon) can be predominantly converted to aluminum fluoride upon exposure of the surface to a composition according to the invention at room temperature for several minutes. The aluminum fluoride surface layer can be removed from the Al layer to leave a clean metal surface upon treatment with a composition according to the invention.

It is surprising and unexpected that formulations containing a fluoride salt (and optionally a hydroxyl-containing amine compound) could nonetheless de-fluorinate a metal surface such as aluminum, especially when similar components, although in different amounts, in a formulation can be used to fluorinate a metal surface such as aluminum under similar conditions.

DETAILED DESCRIPTION OF THE INVENTION

Figure 1A:
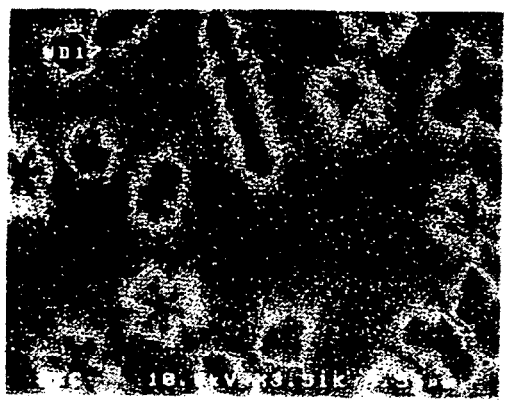
FIGS. 1A-1C show scanning electron microscopy photographs of film surfaces at varying degrees of magnification, showing film surface features before or after exposure to cleaning compositions.

VLSI feature density of ICs has increased dramatically with decreasing geometry of sub-0.25 micron dimensions rendering the ability to pattern metal interconnects more difficult. Subsequent cleaning steps demands merging consistency with process latitude in order to deliver a production worthy process. As metal etch processes have evolved, cleaning has included resist stripping, "side wall polymer" removal, and in today's arena encompasses surface cleaning, which can include mobile ion reduction and removal of oxidized metal surfaces. This scenario ushered in the recent popularity of fluoride based semi-aqueous cleaning (SAC™) chemistries for post metal etch cleaning. Certain aspects of these chemistries are very attractive to end-users. SAC™ chemistries can clean various types of metal structures, including vias, run room temperature operation, have very short process times, are easily rinsed in water, and are easily disposed.

Traditional IC chemical cleaning products are typically based on hydroxylamine or solvent formulations with active additives designed to clean VLSI silicon wafers with minimum effect on metal surfaces and interconnects. Many newer cleaning products designed for sub-0.25 micron dimensions contain ammonium or amine fluoride, pH buffering agents, water-soluble organic solvents and water. Several related formulations are considered in this effort, e.g., identified as FA, FB, etc., and modifications thereof. These semi-aqueous chemistry formulations contain a majority of a non-aqueous solvent such as N,N-dimethylformamide (DMF), N,N-dimethylacetamide (DMAC), N-methylpyrolidinone (NMP), dimethylsulfoxide (DMSO), or the like, or mixtures thereof, a small amount of ammonium fluoride, a small amount of an amine for pH control and about twenty five to about forty percent water, resulting in a product having a pH of about 9.0. Formula FA has a complex effect on aluminum film surfaces in that the rates of surface etch may change with time, fluoride concentration and the type of amine. The dissolution rate of aluminum metal can be dependent on pH, dissolved aluminum concentration and other reactive ions. Thin films have been investigated using electrochemical methods including open circuit potential and impedance spectroscopy, as well as spectroscopic techniques including FTIR, XRD, and spectral ellipsometry. A number of electrochemical experiments were conducted in this work to illuminate the variables of the cleaning process and to determine the molecular mechanism of aluminum surface dissolution. A process model was established and a molecular mechanism has been proposed consisting of a series of chemical reactions describing multi-sloped open circuit electrochemical potentials. These measurements and process analyses have lead to a detailed understanding of the amine fluoride SAC™ cleaning process for ICs and a better understanding of the aluminum surface chemistry itself. In addition, beneficial re-passivation of cleaned metal surfaces was noted.

The cleaning composition of this invention is, in one preferred embodiment, organoammonium and amine carboxylate free. Several advantages are achievable by being able to eliminate organoammonium and amine carboxylate compounds from the compositions. Eliminating these compounds reduces cost of the product. Organoammonium and amine carboxylate compounds both also belong to a class of compounds called phase transfer catalysts. Such compounds, under certain solvent conditions, can accelerate undesirable side reactions, e.g., activation of hydroxide or halide reactions (which can corrode metal surfaces), as reported by "Phase-Transfer Catalysis in Industry," A Practical Guide and Handbook, March 1991, PTC Interface, Inc. Marietta, Ga. The presence of these compounds in the chemistries can also introduce additional cationic and anionic contamination as raw material sources. In one embodiment, the composition can be substantially free of (i.e., containing less than about 0.2% of, preferably less than about 0.1% of, more preferably less than about 0.04% of) phase transfer catalysts, including organoammonium compounds and/or amine carboxylate compounds.

The cleaning composition according to the present invention advantageously contains one or more fluoride compounds. Suitable fluoride compounds include, but are not limited to, ammonium fluoride, ammonium bifluoride, hydrogen fluoride, and any combination thereof. The preferred fluoride compounds are ammonium fluoride and ammonium bifluoride. If hydrogen fluoride is employed, a buffer may be required to bring the pH between about 7 and about 10. The fluoride compounds are desirably present in an amount of from about 0.01 weight percent to about 5 weight percent, preferably from about 0.05 weight percent to about 5 weight percent. In general, the lower the concentration of the fluoride compound in the composition, the higher the temperature of use needs to be. A low fluoride composition can typically have between about 0.01% and about 0.5%, e.g., between about 0.05% and about 0.2%, by weight of a fluoride-containing compound. The ammonium fluoride or bifluoride can alternately be substituted ammonium fluoride or substituted ammonium bifluoride, e.g., with substituted groups including alkyl, alkoxy, hydroxyalkyl, aminoalkyl, alkylamino, aldehyde, or the like, or combinations thereof. Such moieties can partially shield the fluoride atom(s), so that the amount of fluoride-containing compounds in such embodiments can advantageously be between about 1% to about 5%, e.g., about 1.5% to about 4%, by weight.

The cleaning composition can also advantageously contain one or more organic amide solvents. Suitable organic amide solvents include, but are not limited to N,N-dimethylacetamide, N,N-dimethylformamide, and the like, and combinations thereof. The preferred organic amide solvent is N,N-dimethylacetamide. The organic amide solvents can be used either singly or as mixtures. The composition can optionally also contain an alkyl sulfoxide, such as dimethyl sulfoxide.

In some embodiments, the cleaning compositions according to the invention may contain other organic solvents. In other embodiments, the cleaning compositions according to the invention may contain substantially no polar organic solvents that are not either amides or sulfoxides.

The cleaning composition generally also contains water. Typically high-purity deionized water is used.

The composition can optionally contain corrosion inhibitors. Suitable corrosion inhibitors include, but are not limited to, inorganic nitrate salts such as ammonium, potassium, sodium and rubidium nitrate salts, as well as aluminum nitrate, zinc nitrate, and the like, and combinations thereof.

The composition can optionally contain chelating agents. Some suitable chelating agents are described in commonly assigned U.S. Pat. No. 5,672,577, issued Sep. 30, 1997 to Lee, which is incorporated herein by reference. Preferred chelating agents include catechol, lactic acid, glycolic acid, citric acid, and combinations thereof.

The composition can optionally contain up to about 3% by weight of surfactants. Suitable surfactants include, but are not limited to, poly(vinyl alcohol), poly(ethyleneimine), any of the surfactant compositions classified as anionic, cationic, nonionic, amphoteric, and silicone-based, and the like, and combinations thereof. Preferred surfactants include poly(vinyl alcohol) and/or poly(ethyleneimine).

Some combinations of components can require the addition of acids and/or bases to adjust the pH to an acceptable value. The acids suitable for use in the present invention can be organic or inorganic and can include, but are not limited to, nitric, sulfuric, phosphoric, hydrochloric (though hydrochloric acid can be corrosive to metals), and the like, and combinations thereof, and/or formic, acetic, propionic, nbutyric, isobutyric, benzoic, ascorbic, gluconic, malic, malonic, glycolic, oxalic, succinic, tartaric, citric, gallic, and the like, salts thereof, and combinations thereof. The last five organic acids are also examples of chelating agents.

Concentrations of the acids, when present, can vary from about 0.1 to about 25 weight percent, e.g., between about 0.5% and about 5% by weight. One important factor to consider is the solubility of the acid and base products, along with any additional agents, in the aqueous solutions.

The caustic components suitable for use to adjust the pH of the cleaning solution can include any common base(s), e.g., sodium, potassium, or magnesium hydroxides, or the like, or a combination thereof. One major problem is that these bases can introduce mobile ions into the final formulation. Mobile ions could destroy computer chips being produced today in the semiconductor industry. Advantageously, therefore, compositions according to the present invention preferably include less than about 200 ppm, more preferably less than about 20 ppm, of such mobile metal ions. Other bases can include choline salts, bis-choline salts, tris-choline salts, ammonium salts such as ammonium hydroxide, tetraalkylammonium salts such as tetramethylammonium hydroxide, or the like, or a combination thereof.

Operation:

The method of cleaning a substrate using the cleaning compositions of the present invention can involve contacting a substrate having residue thereon, particularly organometallic or metal oxide residue, with a cleaning composition of the present invention for a time and at a temperature sufficient to remove the residue. Stirring, agitation, circulation, sonication or other techniques as are known in the art optionally may be used. The substrate can be a semiconductor wafer, a thin film display, an advanced memory device, a hard disk data storage device, an inkjet printer cartridge head, or the like. The substrate is generally immersed in the cleaning composition. The time and temperature can be determined based on the particular material being removed from a substrate. Generally, the temperature is in the range of from about ambient or room temperature to about 100° C. and the contact time is from about 1 to about 60 minutes. The preferred temperature and time of contact for this invention is about 25 to about 45° C. for about 2 to about 60 minutes. Generally the substrate will be rinsed after using the composition. Preferred rinse solutions include isopropanol and/or deionized water.

The compositions of the invention can be particularly useful for removing residue from metal and via features.

The compositions of the invention can be particularly useful on substrates having low-k dielectrics. Low-k dielectrics are known in the art and include, but are not limited to, fluorinated silicate glass (FSG), hydrido-organosiloxane polymer (HOSP), low organic siloxane polymer (LOSP), nanoporous silica (Nanoglass), hydrogen silsesquioxane (HSQ), methyl silsesquioxane (MSQ), divinysiloxane bis (benzocyclobutene) (BCB), silica low-k (SiLK), poly (arylene ether) (PAE, Flare, Parylene), fluorinated polyimide (FPI), and the like, and combinations thereof.

Figure 1B:
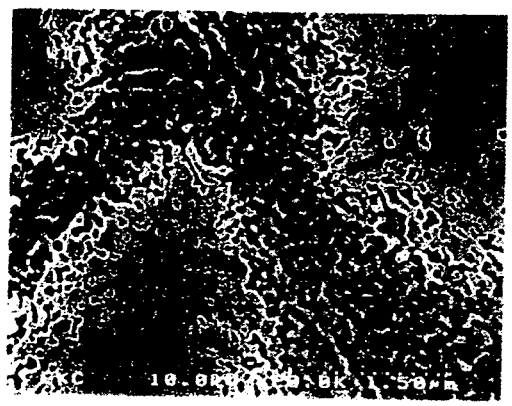

Experimental Methods and Measured Results:

Two kinds of aluminum films were tested during this investigation, pure aluminum and aluminum containing 0.5 percent copper. The surfaces of these films were observed by SEM before and after exposure to Open Circuit Potential (OCP) measurements of the immersed films, SEM images of 0.5 percent copper in aluminum following immersion in formula FA showed regular isolated images (copper islands) at 3,500× magnification, edge regions at 20,000× magnification and a corresponding rough porous surface at 90,000× magnification (see FIGS. 1A-1C). SEM images of pure aluminum following immersion in formula FA showed a textured surface at 5,000× magnification and edges and high points at 50,000× magnification. Light (bright) regions of the photographs indicate local charging of the non-conductive (non-metallic) surfaces, by the electron beam (see FIGS. 2A-2B).

Metal film surface thicknesses of 5,700 Å were measured for aluminum coated silicon wafers using a Four Dimension, Inc., model 280S, four-point probe. The results (analyzed without standards) varied within a range of ±50 Å per nine-point measurement.

OCP measurements were conducted for 0.5 percent copper in aluminum coated silicon wafers (1 cm×2 cm coupons) with 1 cm² immersed in formula FA at 22±2 C without agitation. The standard formula FA formulation removed 522 Å of metal in a 40 minute time frame while the OCP measurements demonstrated a higher removal rate under conditions of a closed electrical circuit. Similar results were obtained for pure aluminum. See data presented in Table 1 for OCP curves. No significant process differences were observed between aluminum and 0.5 percent copper in aluminum so the materials were not distinguished.

TABLE 1

Removal Rate of Aluminum In Formula PA During OCP Measurements

| Exposure Time (minutes) | Cumulative Al Removed in FA, (Angstroms) | Cumulative Al Removed in Amine Fluoride (FB)* (Angstroms) | Al Removed During Non-QOP Immersion (Angstroms) |
|---|---|---|---|
| 1.0 | 185 | 12 | — |
| 2.0 | 433 | 88 | — |
| 5.0 | 667 | 453 | — |
| 10.0 | 935 | 1,006 | — |
| 15.0 | 1,297 | 1,921 | — |
| 20.0 | 1,548 | 2,955 | — |
| 30.0 | 1,757 | 5,030 | 522 (at 40 mins) |

*Formula FB = Formula FA with the same percentage of diisopropylethylamine fluoride replacing ammonium fluoride.

A computer controlled electrochemical interface (SOLARTRON™ 1260) as driven by Scribner software was employed for the electrochemical measurements. Electrochemical measurements were conducted for formula FA over a range of pH values and fluoride concentrations. A pair of platinum electrodes were treated repeatedly with concentrated nitric acid, and rinsed with deionized water, until repeated polarity reversal potentiodynamic scans produced the same result to within 0.0002 volt. A 15 mL electrochemical cell was established using the 1 cm² of immersed aluminum film as a working electrode and one of the 5 mm wide×0.025 mm thick platinum ribbons as a counter electrode.

Cyclic voltammogramic measurements conducted in air exhibited a small positive current flow at −0.08 volt indicating an active half cell potential. In the absence of air no current flow was observed.

Figure 3:
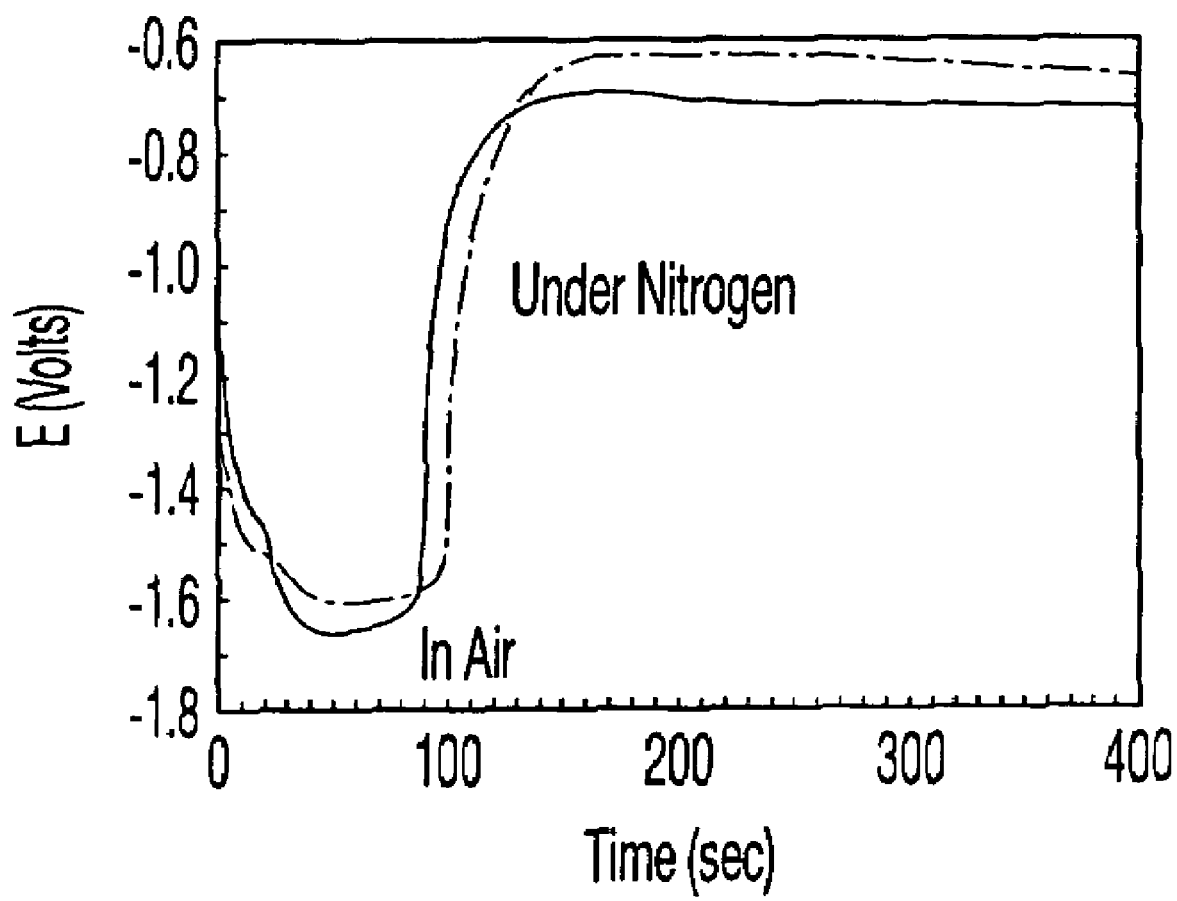
FIG. 3 shows the difference between open circuit potential (OCP) measurements of Formula FA in an air environment and where a nitrogen environment is used.

Open Circuit Potential (OCP) measurements were conducted using modified versions of formula FA for 400 seconds by immersing the aluminum working electrode 1 centimeter from the counter electrode and immediately initiating the measurement. Results of potential were recorded as a function of time where the resulting current drain was 6±1 nanoamperes/cm$^2$. The OCP curve for formula FA at pH=9 exhibited a rapid decrease in potential to −1.66 volts, a 100-second plateau region, a rapid decrease in potential followed by a slow change of potential to −0.7 volt in air and −0.65 volt under nitrogen. Refer to FIG. 3. A number of OCP measurements were conducted in a pH range of 6 to 10, using a combined glass electrode with a Corning pH meter, using monoethaolamine to increase pH and hydrochloric acid to decrease pH. Results showed the OCP plateau duration increased with increasing pH while the passive potential of the polarization curves decreased with increasing pH. Refer to the data presented in Table 2. Potentiodynamic scan measurements were also conducted using the same parameters; refer to Table 2.

TABLE 2

Effect of pH on Electrochemical Properties of 0.5% Cu/Aluminum

| Formula FA pH | Plateau Duration (seconds) | Plateau Potential (volts) | Passive Potential (volts) | Corrosion Current (amperes) |
|---|---|---|---|---|
| 9.5 | 120 | −1.45 | −0.7 | — |
| 9.0 | 100 | −1.66 | −0.98 | 5E−7 |
| 8.5 | 40 | −1.62 | −0.83 | 5.5E−7 |
| 8.0 | 10 | −1.58 | −1.0 | 5E−7 |
| 7.0 | <5 | −1.52 | −1.1 | 5E−7 |
| 6.0 | <5 | −1.41 | −1.1 | 7E−7 |
| 5.0 | <5 | −1.51 | −1.2 | 6E−6 |

Open Circuit Potential (OCP) measurements were also conducted for aluminum coupons immersed in freshly prepared formula FA formulations, as describe above, where the fluoride concentration was adjusted between 0 and 3 weight percent. No plateau was observed in the absence of fluoride. Fluoride concentrations in the region of 0.05 to 0.5 percent decreased the OCP from −0.5 volt to approximately −1.6 volts but fluoride (salt) concentrations greater than 0.5 percent had only a small additional effect. Refer to the data presented in Table 3.

TABLE 3

Effect of Fluoride Concentration on 0.5% Cu/Aluminum OCP

| Fluoride Concentration (%) | Open Circuit Potential (volt) |
|---|---|
| 0.0 | −0.53 |
| 0.05 | −1.42 |
| 0.1 | −1.54 |
| 0.5 | −1.66 |
| 1.0 | −1.66 |
| 3.0 | −1.66 |

A formula containing a strong amine and possessing a natural pH of 9 displaced ammonia vapor from ammonium fluoride in solution. The ammonia was stripped as vapor. OCP measurements and ammonia concentration measurements (Quantofix™ Ammonium test strips, of Macherey-Nagel GmbH & Co. KG) were conducted over a 27 hour period in a stirred FA solution. The plateau time decreased from 100 seconds to less than 10 seconds during prolonged bath exposure as the ammonia concentration declined. Refer to data Table 4.

Figure 4:
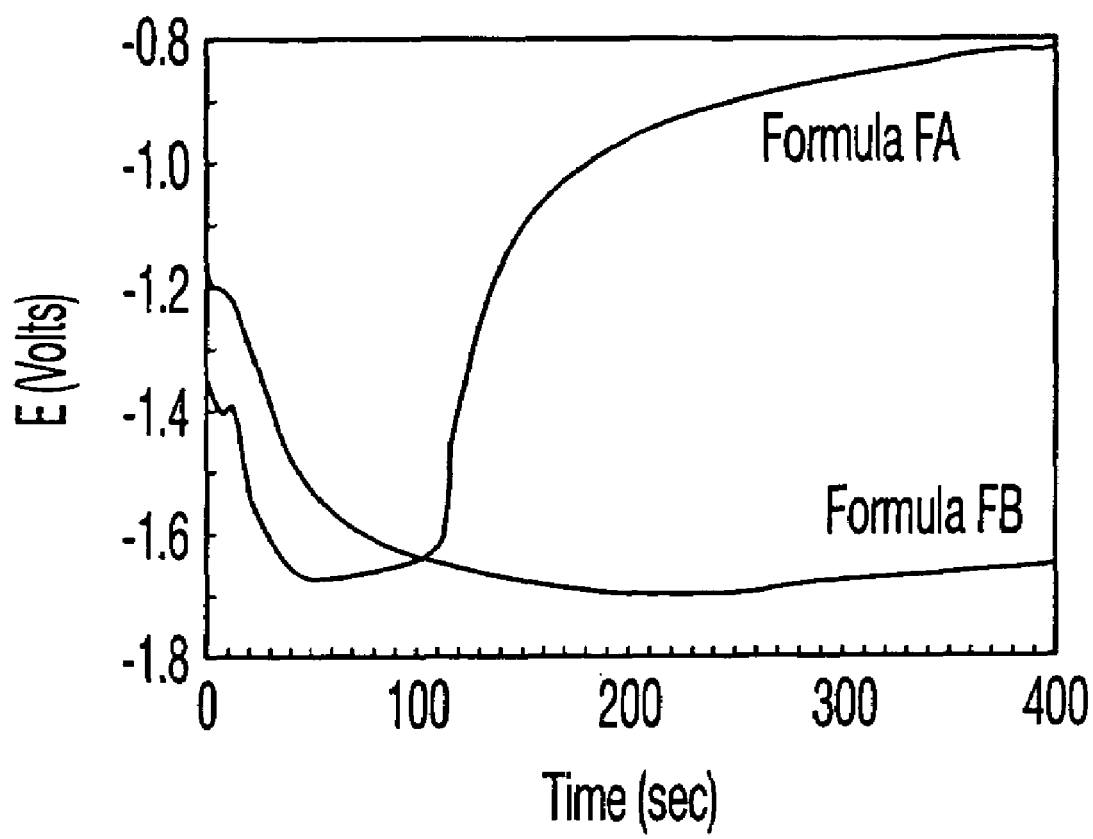
FIG. 4 shows the difference between open circuit potential (OCP) measurements on metal-containing layer removal rate using compositions containing ammonium fluoride vs. diisopropylethylammonium fluoride.

Another set of OCP measurements was conducted in formula FA modified by replacing ammonium fluoride with diisopropylethylammonium fluoride creating formula FB. This formula was stable with time as no ammonia was present. An OCP of aluminum film exhibited a rapid increase in negative potential to approximately −1.6 volts but the plateau continued indefinitely and aluminum metal was dissolved more rapidly than with ammonium fluoride, refer to FIG. 4 and the data in Table 1. An OCP measurement conducted for 8,000 seconds removed 98 percent of the aluminum film.

TABLE 4

OCP and Natural pH of Formula FA as a Function of Exposure Time.

| Exposure Time (hours) | pH | OCP Plateau (minutes) | Ammonia Conc. (mg/L) |
|---|---|---|---|
| 0 | 9.20 | 100 | 5,000 |
| 0.5 | 9.16 | 23 | — |
| 1 | 9.07 | 15 | 3,600 |
| 2 | 8.99 | 12 | 3,200 |
| 5 | 8.75 | <10 | — |
| 27 | 8.41 | <10 | 1,400 |

Figure 5:
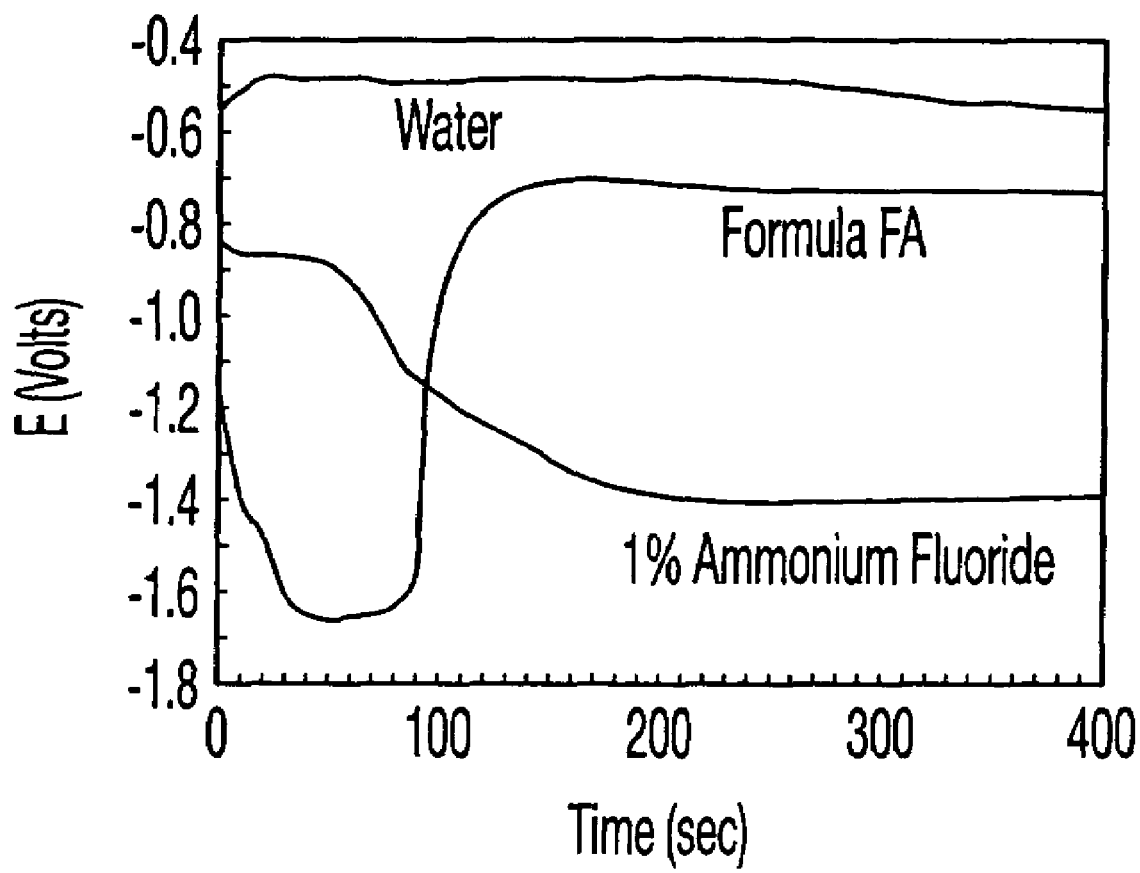
FIG. 5 shows the difference between open circuit potential (OCP) measurements on metal-containing layer removal rate using water, Formula FA, and a 1% ammonium fluoride solution.

The diisopropylethylammonium fluoride (FB) formulations were carefully adjusted to pH values of 8.5, 9.0, and 10.0 using excess amine, and their OCP potentials were measured. OCP potentials were −1.66 volts at pH=8.5, −1.5 volts at pH=9.0, and −1.43 volts at pH=10.0, and continued flat indefinitely dissolving the aluminum film. An OCP graph of Al in water at pH=9 was nearly constant at −0.5 volt and one percent ammonium fluoride at pH=9 resembled the diisopropylethylammonium fluoride of FIG. 4. Refer to FIG. 5. The pH=9.0 version of the diisopropylethylammonium fluoride (FB) formulation was modified by addition of 0.5 percent of ammonium nitrate. This caused the OCP plateau to terminate after approximately 50 seconds where the potential declined to approximately −0.65 volt after 400 seconds. Addition of potassium nitrate in place of ammonium nitrate caused a similar decrease in potential. Addition of one percent hydrazine plus one half percent hydroxylamine to the diisopropylethylammonium fluoride (FB) formulation also caused the OCP to decline with time.

X-ray photoelectron spectral (XPS) measurements were made of the OCP treated films. Refer to data Tables 5 and 6. OCP measurements conducted using neat formula FA produced a thin coating that was barely visible in reflected light for the sample dried under a stream of flowing nitrogen gas. OCP measurements conducted using 1:1 dilute formula FA produced a distinctly visible white film surface readily observable in reflected light. These samples were thoroughly washed in flowing de-ionized water and dried under a stream of nitrogen gas in preparation for XPS measurements. XPS measurements exhibited the presence of fluoride on the aluminum surfaces. The carbon concentrations were probably a result of adsorbed contamination (such as ambient carbon dioxide) and were not considered further. The fluoride emission near 690 eV indicated the fluoride to be mostly ionic with a smaller contribution of covalently bonded fluorine.

TABLE 5

ESCA Measured Elemental Bond Energies of Aluminum Surface Films

| | Atomic Concentration (percent) | | | | | |
|---|---|---|---|---|---|---|
| Sample ID | O | Al | C | F | N | Cu |
| Formula FA (Neat) | 52.9 | 24.9 | 19.7 | 2.1 | 0.3 | 0.1 |
| Formula FA (1:1 Dilution) | 54.2 | 26.6 | 13.8 | 4.4 | 0.1 | 0.8 |

TABLE 6

ESCA Distribution of Bond Types
for A ~ Surface Film in Neat Formula FA

| | Atomic Concentration of Bond Distribution (percent) | | | |
|---|---|---|---|---|
| Element | C—C/C—H | C—O | C—F | Fluoride Ion |
| C | 15.4 | 2.5 | 1.8 | — |
| F | — | — | 1.5 | 2.9 |

Potentiodynamic traces were recorded as a function of pH (see Table 2), using a saturated Ag/AgCl reference electrode (Bioanalytical Systems), accessed via a fine fit. The passive potential decreased as pH increased. Potentiodynamic traces were also recorded as a function of fluoride concentration. Measurement of the zero crossing of the cathodic and anodic linear Tafel branches of the current-overpotential curve showed the passive potential and current changes with fluoride concentration.

TABLE 7

Effect of Fluoride Concentration on Potentiodynamic Scans

| Fluoride Concentration (%) | Equilibrium Potential (volts) | Equilibrium Current (amperes) |
|---|---|---|
| 0.0 | +0.40 | 2.1E−07 |
| 0.05 | — | 3.5E−07 |
| 0.1 | −0.20 | 5.0E−07 |
| 0.5 | −0.23 | 5.6E−07 (5E−07) |
| 1.0 | −0.34 | 7.0E−07 |
| 3.0 | −0.22 | 9.1E−07 |

Aluminum passivation/dissolution rates were determined by measuring aluminum film thickness on the coupons at the end of each of four timed segments of every OCP scan. Formula FA (55 grams) was placed in an 80 mL beaker and OCP of aluminum coated silicon coupons (35 mm×35 mm) were run for approximately 30 seconds, 130 seconds, 270 seconds, and 400 seconds. Metal thickness values were measured before and after each run using a four-point probe. The same set of measurements was conducted for the amine fluoride formula containing 0.5 percent of ammonium nitrate. See Table 8.

TABLE 8

Four Point Probe Measurements of Cleaned Aluminum Surfaces

| Electrolyte | Run Time (seconds) | Al Removed (Angstroms) |
|---|---|---|
| Formula FA | 30 | 156 |
| Formula FA | 130 | 251 |
| Formula FA | 270 | 241 |
| Formula FA | 400 | 361 |
| Amine Fluoride* (FB) | 30 | 26 |
| Amine Fluoride* (FB) | 130 | 54 |
| Amine Fluoride* (FB) | 270 | 73 |
| Amine Fluoride* (FB) | 400 | 71 |
| Amine Fluoride (no nitrate) | 8000 | >8,500 |

*Half of one percent nitrate was added.

The native surface oxide (passivating film) was not distinguished from aluminum metal in that the four-point probe measured conductive material indiscriminately.

The plateau region for an aluminum coated silicon coupon, immersed in amine fluoride formulation without ammonium nitrate, extended beyond 4000 seconds removing the aluminum film. Tiny bubbles of gas formed on the aluminum surface during the higher potential plateau for the formula FA electrolyte but bubbles were not observed at the lower potentials. Bubbles were not observed during any portion of the cycle with the amine fluoride electrolyte with nitrate.

Aluminum passivation was also affected for the amine fluoride formula by addition of 1 percent hydrazine plus 0.5 percent hydroxylamine. An OCP measurement produced a potential curve exhibiting a 10- to 20-second plateau at −1.17 volts under those conditions. Reduction of the hydroxylaimne concentration increased the length of the plateau but the potential remained in the −1.1 volt range.

Changes in the OCP of FA were recorded as a function of the organic solvent concentrations of 0, 30, 50 and 70 percent for the solvents N,N-dimethylformamicle (DMF), N,N-dimethylacetamide (DMAC), N-methylpyrolidinone (NMP) and dimethylsulfoxide (DMSO). Refer to FIGS. 8, 9, 10, 11. It was observed that the plateau potentials of 70 percent solvent formulae for DMF and NMP decreased from −1.5 or −1.6 to −1.66 volts when the pH was decreased from 9 to 8. OCP of FA diluted with increasing concentrations of added water, including 5%, 10%, 25%, 50% and 67%, were also recorded. The curves were quite similar to those of varying organic solvent concentrations.

OCP and cyclic voltammogramic measurements were performed for aluminum immersed in one percent aqueous ammonium fluoride solution (no organic co-solvent present) exposed to air, completely dissolving the aluminum film. These same measurements were also performed in the absence of air where the minimum potential was −1.45 volts and still the aluminum film dissolved.

Aluminum, an amphoteric metal that readily dissolves, in non-oxidizing acid and alkaline solutions, and oxidizes in water, forms native oxide films to naturally protect the chemically active aluminum surfaces in air. The formula FA residue remover product, employed in semiconductor wafer cleaning processes, has been observed to remove the surface from aluminum films on silicon wafers. Galvanic corrosion at the boundaries of aluminum-copper grains has been reported for aluminum-copper alloys but this type of corrosion is not observed for aluminum in fluoride based SAC™ chemistry systems. Removal of 522 Å of surface material during the final 40 minutes of exposure of an aluminum coated wafer to formula FA indicated a removal rate of 13

Å per minute. Replacement of the ammonium fluoride by diisopropylethylammonium fluoride (FB) caused the removal rate to increase to over 207 Å per minute during this same time frame, approximately a 13-fold increase. It is apparent that the remover chemistries exert an effect on metal removal rate through formation of complex compounds. The amines present in formula FA included low concentrations of ammonium fluoride and monoethanolamine (MEA). This mixture was shown to dissolve aluminum although the actual chemical dissolution mechanism was not well understood.

Exposure of aluminum coated wafers to the formula FA remover caused the OCP to rapidly approach −1.6 volts while OCP measurements of equivalent formulations with no fluoride present began at −0.73 volt asymptotically increasing with time to approximately −0.55 volt. This indicated the fluoride ion was responsible for dissolution of the natural surface passivation layer exposing the bare aluminum surface to the chemistry. The potential abruptly decreased at the end of the plateau from −1.6 volts to −0.8 volt after some 150 to 170 second immersion shifting to approximately −0.7 volt after several hundred seconds. Measured OCP of the diisopropylethylammonium fluoride (FB) formulation maintained −1.6 volts for >400 seconds (refer to FIG. 4), and showed no indications of decreasing after 1,000 seconds. Addition of 0.5 percent of ammonium or potassium nitrate did cause the potential to decrease in a manner similar to that observed for the ammonium fluoride based FA formula probably due to passivation through oxidation of the aluminum surfaces, as indicated in equation (1):

$$2Al + 3NO_3 \rightarrow Al_2O_3 + 3NO_2 \tag{1}$$

The amount of aluminum removed by the FA formulation was approximately four to five times that removed by the diisopropylethylammonium fluoride (FB) formulation with added nitrate. Addition of an oxidizing agent did result in a rapid change in potential. The FA formula had no such oxidizing agent present initially yet displayed a sharp decline in potential indicating a passivating compound was apparently generated during the OCP measurement. Thus, a working model of the OCP profile had emerged: initial immersion in alkaline fluoride formulations dissolved surface oxides, potentials near −1.6 volts indicated aluminum oxidation had occurred and a rapid potential change toward zero indicated surface passivation, probably by means of aluminum oxidation, had occurred. The resulting OCP currents were typically 6±1 nanoamperes/centimeter$^2$, throughout the time of the measurements indicating only trace levels of aluminum driven electrochemical formation of passivation agents.

SEM photographs were recorded for pure aluminum films and aluminum films containing 0.5 percent copper before and after exposure to OCP measurements during immersion. Refer to FIGS. 1 and 2. Lighter regions of the photographs indicated local charging of the non-conductive or passivated aluminum films by the electron beam.

XPS measurements of aluminum surfaces passivated by the FA formula showed the surface layer contained over eight atomic percent fluoride relative to aluminum indicating formation of aluminum fluoride. Reductions in solvent concentration resulted in a decrease in OCP plateau potential and a concomitant increase in plateau width. Aluminum fluoride apparently formed by means of a hydroxide fluoride ion exchange reaction, as indicated by the reaction equation:

$$Al(OH)_3 + 3F \rightarrow AlF_3 + 3OH \tag{2}$$

Aluminum fluoride is only slightly soluble in water above a pH of 7 and in the absence of excess fluoride ions. One percent aqueous ammonium fluoride solutions did not dissolve aluminum at pH=9 in the absence of the organic co-solvent but aluminum dissolution was effective with organic co-solvents in the 50 to 70 percent range demonstrating the necessity of an organic solvent for exposing clean aluminum metal surfaces. The degree to which aluminum fluoride is formed depends on pH (concentration of hydroxide ions present) and availability of complexing ions or ligands, so its rate of dissolution becomes condition dependent. Even the concentration of carbon dioxide in solution can effect the degree of aluminum fluoride formation and dissolution. As soon as bare aluminum was exposed (native oxidation layer removed) it began to oxidize probably as shown in equation (3):

$$Al + 3H_2O \rightarrow Al(OH)_3 + 3/2H_2 \tag{3}$$

This cycle of surface cleaning/surface dissolution might have continued indefinitely except for the presence of an oxidizing agent to form an aluminum oxide barrier. Since ammonium fluoride and aluminum metal were the primary electro-active species present in the aqueous medium of formula FA, but absent in FB, then ammonium ion may have been electrochemically oxidized under the −1.6 volt of the aluminum dissolution potential. Refer to the seven-step chemical reaction model near, refer to FIG. 4.

In addition, exposure of a bare aluminum surface to dissolved oxygen may provide an alternative pathway for electrochemical oxidation (−1.26 volts) as the following reaction sequence (4) through (7) indicates:

$$NH_4OH \rightarrow NH_4^+ + OH^- \tag{4}$$

$$2NH_4^+ + 1/2O_2 + 2OH^- \rightarrow N_2H_4 + 3H_2O \tag{5}$$

$$N_2H_4 + 1/2O_2 + H_2O \rightarrow 2NH_2OH \tag{6}$$

$$2/3Al + 2NH_2OH \rightarrow 1/3Al_2O_3 + N_2H_4 + H_2O \tag{7}$$

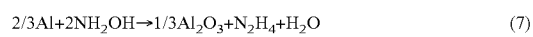

Thus, oxidative formation of trace concentrations hydroxylamine and/or its oxidation products (such as nitrite or nitrate ions) is believed to have provided the passivating agent necessary to reduce the rate of aluminum corrosion. A higher concentration of hydroxylamine would not allow aluminum to attain its redox potential. OCP measurements of aluminum in one percent ammonium fluoride at pH=9 in the absence of air demonstrated aluminum did not passivate; however, it did passivate when the solvent contained 70 percent dimethylacetamide in water in the absence of air. This implied that a second passivation mechanism involving solvent hydrolysis or product impurities may have been active. Additional electrochemical measurements were conducted indicating the base form to be more active in passivation of aluminum than the acid form. Cyclic voltammogramic measurements of dimethylacetamide with and without additions of acetic acid and diethylamine (adjusted to pH=9) indicated dimethylamine became oxidized providing a second possible passivating agent for aluminum. Since the cell current was only 6 nanoamperes, then trace quantities of dimethylamine would be anticipated.

OCP measurements of the quaternary amine fluoride formulae did not display a decline in plateau potential until at least 3000 seconds into the run, after which the curve appeared to step down through distinct regions presumably reflecting the oxidation potentials of several intermediate oxidized amine products. The concentration of quaternary amine in the formulation FB was 4.2 mmol, and the concentration of alkylquaternary amine in formula FA was 0.33 mmol, a ratio of about 12.7:1. The ratio of measured aluminum dissolution rates of 12.9 was quite similar to the ratio of the quaternary amine concentrations, indicating the aluminum dissolution rate depended on the quateramine fluoride concentration.

There have been questions relating to the possible presence of $HF_2$, the bifluoride ion, in these solutions at pH=9. This species is active in acidic media, but its existence is questionable in alkaline media, where the presence of hydroxide ion can disassociate the acid bifluoride ion.

At pH=9, the presence of excess hydroxide ions can shift the equilibrium of ammonium hydroxide from the left to the right, as indicated by equation (8):

$$NH_4^+ + OH^- \leftarrow\rightarrow NH_3 + H_2O \tag{8}$$

resulting in a reduced availability of ammonium ion in solution and a continuing loss of ammonia vapor until the solution becomes depleted.

Measurement of the over potential by OCP methods offers an opportunity to measure average passivation film thickness that has been accomplished previously by optical ellipsometry. Electron transfer from a planar metal electrode to an oxidized species in an unstirred solution has been described by the Sand equation (12; below). This expression describes the flux of a dissolved species from the planar electrode surface during transition time, $\tau$, at a rate governed by the current density. Once the transition time, $\tau$, has passed and the available species has been oxidized, the potential must decrease as a new charge carrier is indentured. These measured variables can be used to determine the concentration, $C_0^*$, of the electron carrier as:

$$C_0^* = 2i\tau^{1/2}/(n\mathcal{F}AD_0^{1/2}\pi^{1/2}) \tag{9}$$

for $C_0^*$ in mol/cm³; n, the number of equivalents of electron charge per mol; $\mathcal{F}$, Faraday's constant; $D_0$, the diffusion constant; and i/A, the current density in amperes/cm². For a transition time, $\tau$, of 100 seconds and a current density of $6\times10^{-9}$ amperes/cm², a concentration of $2.3\times10^{-8}$ mol/cm³, or $6.3\times10^{-7}$ gram/cm³, was calculated for maximum dissolved aluminum. One monolayer of aluminum from a 1 cm² surface is estimated to contain approximately $(6\times10^{22})^{0.67}$, or $1.5\times10^{15}$, atoms, so that the concentration of surface atoms is calculated to be $1.5\times10^{15}/6\times10^{22}$, or $2.5\times10^{-8}$ mol/cm³. Thus, the 6 nanoampere current accompanying the $-1.6$ volt potential plateau apparently removed on the order of one atomic layer of aluminum. These regions may be observed as light regions on the SEM photographs (FIG. 1) where surface layers several atoms deep were removed in isolated passivated regions.

Consider the decrease in the surface concentration of aluminum with time, as represented by equation (13):

$$-dN(Al)/dt = kC(Al^{3+}) \tag{10}$$

where N is surface aluminum metal concentration in mol/cm²; $C(Al^{3+})$ is the concentration of aluminum in solution at the metal surface; and k is the linear dissolution rate constant in cm/sec. Dissolution of the aluminum surface is represented by the electronic charge transferred as $q=n\mathcal{F}N$, and the equivalent current density is $i=(dq/dt)=n\mathcal{F}(dN/dt)$. On rearranging, $-dN/dt=-i/(n\mathcal{F})=kC(Al^{3+})$, and $-n\mathcal{F}dN=-idt=n\mathcal{F}kC(Al^{3+})dt$. The linear surface dissolution rate, k, is a function of time and may be expressed as the function: $k=k_0(1-e^{-\omega t})$, where $\omega$ represents the apparent electrical conductivity of the surface metal, and where $k_0$ is a constant. Then, $n\mathcal{F}kC(Al^{3+})dt=n\mathcal{F}k_0(1-e^{-\omega t})(Al^{3+})dt$, where $k_0$ may be determined by experimental measurement.

Upon integration, $-\int idt = n\mathcal{F}C(Al^{3+})\int k_0(1-e^{-\omega t})dt = n\mathcal{F}C(Al^{3+})[tk_0+(k_0/\omega)]$, to be evaluated at t=0 and at t=100 seconds, to produce $k_0[100-(1/\omega)]$. An aluminum removal rate of $k_0=59$ Å/minute=$5.9\times10^{-7}$ cm/minute was measured during the first thirty minutes (a reduced removal rate was measured later, as the concentration of passivating oxidizer increased); the electrical conductivity of pure aluminum is $\omega=3.77\times10^5$/ohm-cm at 293 K, and for aluminum containing less than one percent copper, $\omega=3.51\times10^5$/ohm-cm at 293 K. Thus, a calculated value of $-\int idt = -i\tau = 5.9\times10^{-7}$ ampere·seconds since the contribution of $(1/\omega)$ is negligible. This value is in reasonable agreement with the measured current of $6\times10^{-7}$ ampere·seconds. Should the $k_0$ value be taken as the average over sixty minutes of measurement, where the aluminum electrode became partially passivated, the result would have been $k_0=3.4\times10^{-7}$ ampere·seconds.

Aluminum surfaces can also be attacked by parasitic, non-electrochemical reactions. These secondary reactions can cause corrosion of the aluminum surface in effect increasing the thickness of metal removed.

Figure 6:
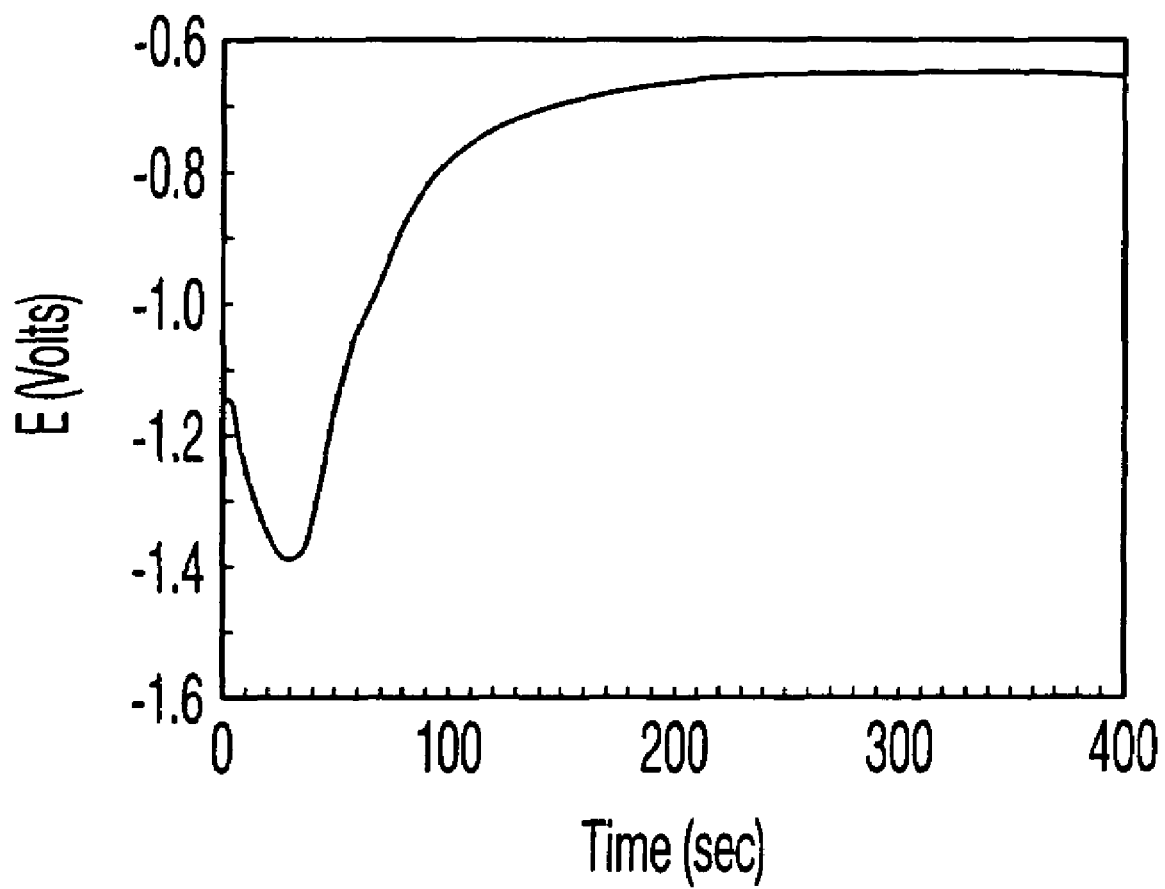
FIG. 6 shows a standard OCP curve for aluminum immersed in remover.
Figure 7A:
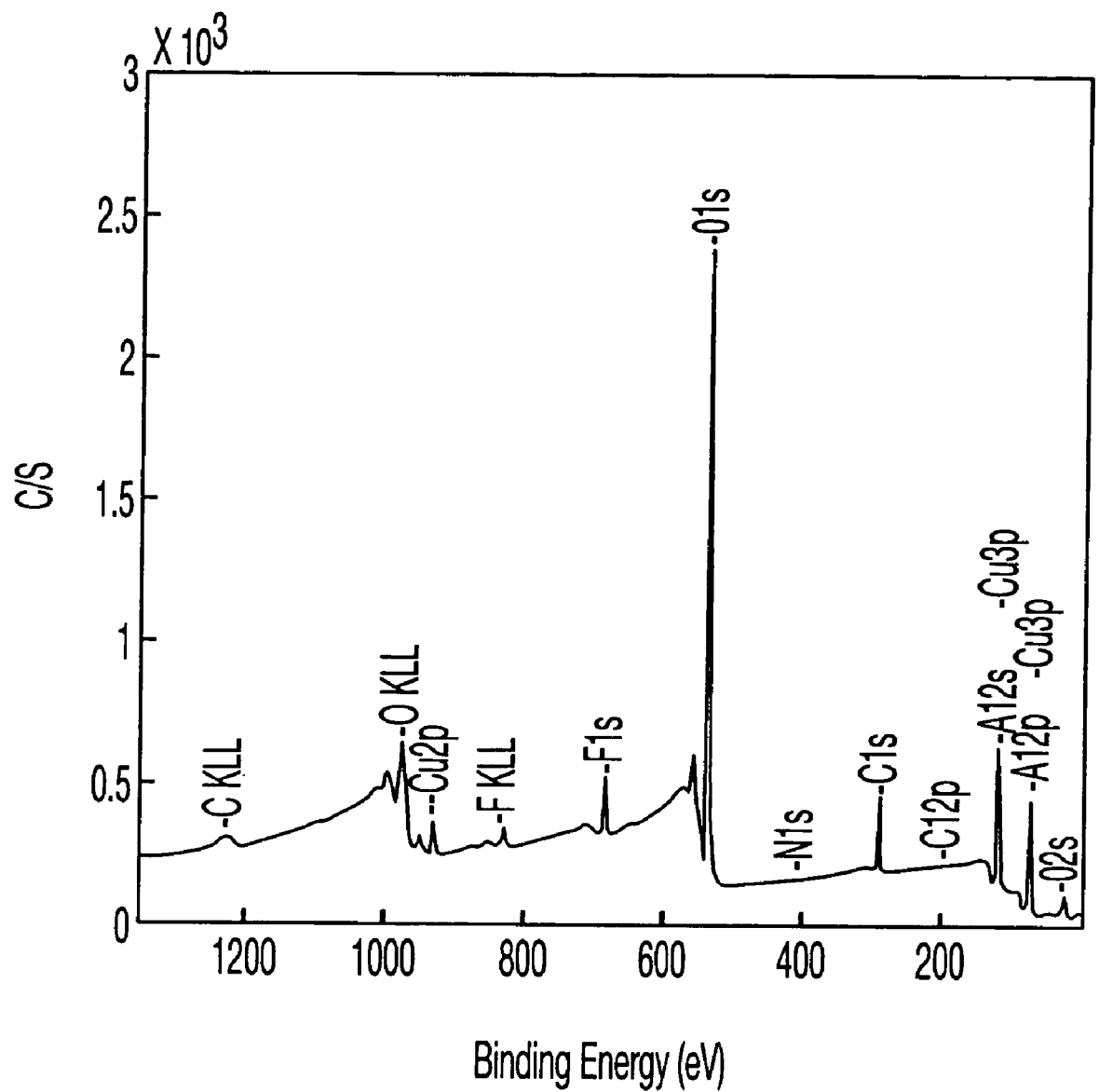
FIG. 7a shows the binding energy spectral analysis for an aluminum surface after being immersed in Formula FA.
Figure 7B:
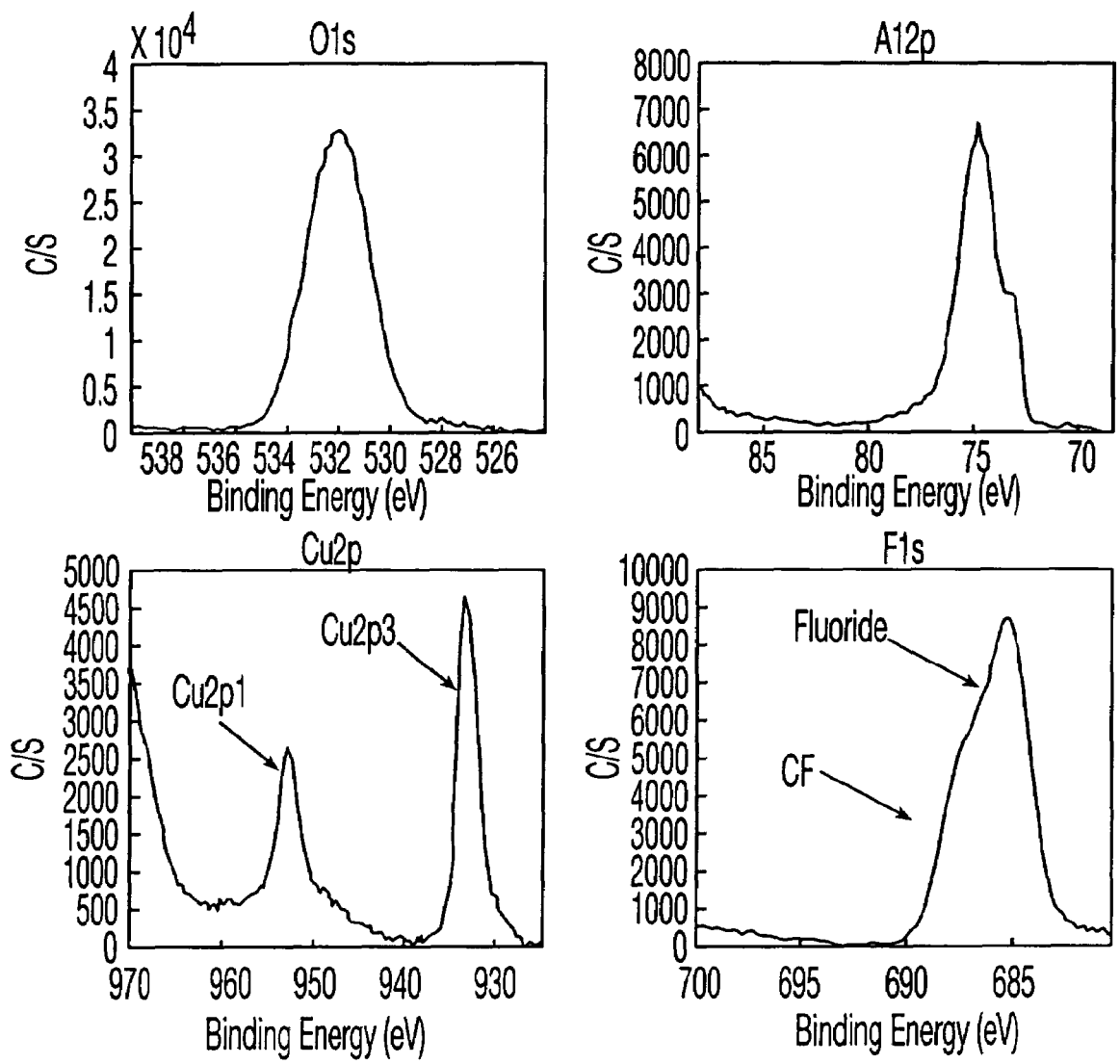
FIG. 7b shows enlarged portions of FIG. 7a for certain components.
Figure 8:
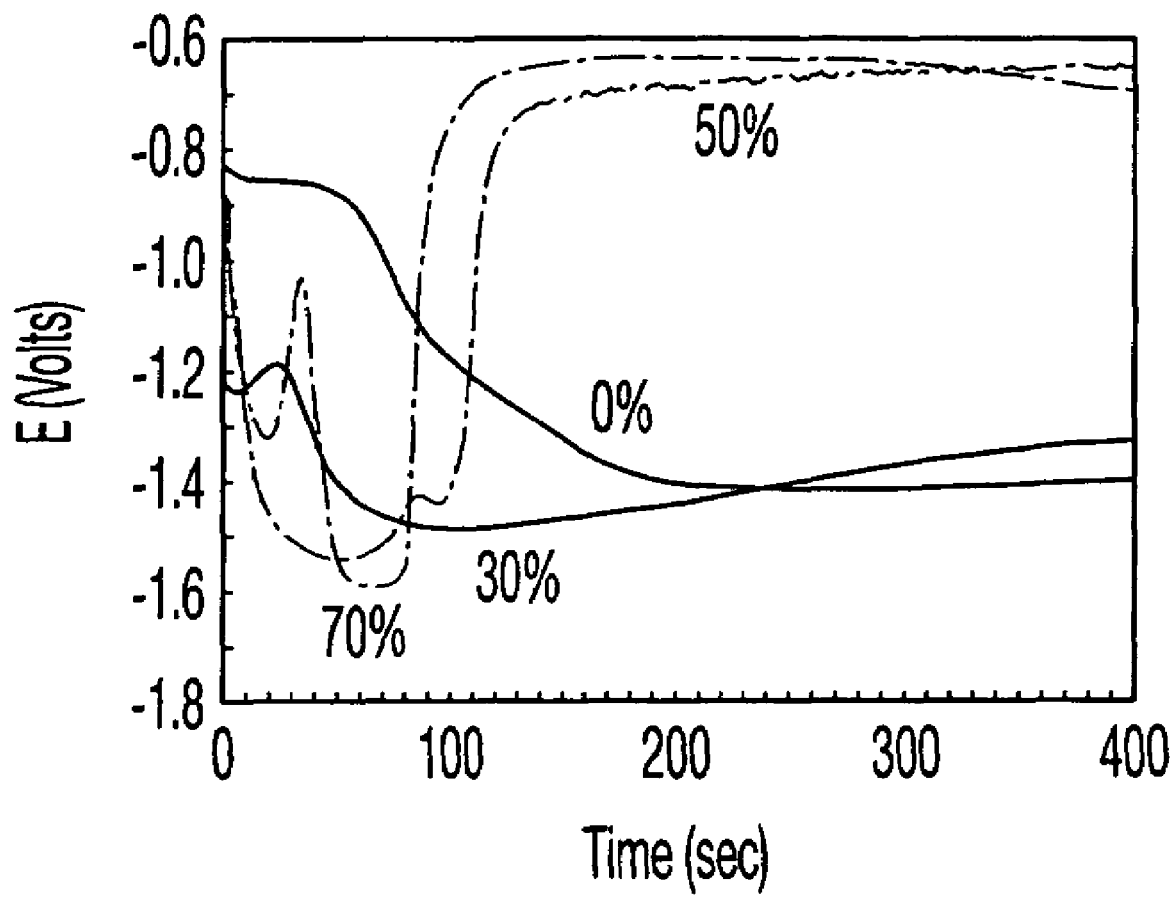
FIG. 8 shows the changes in the OCP of FA as a function of the organic solvent concentrations of 0, 30, 50 and 70 percent for the solvent N,N-dimethylformamide (DMF).
Figure 9:
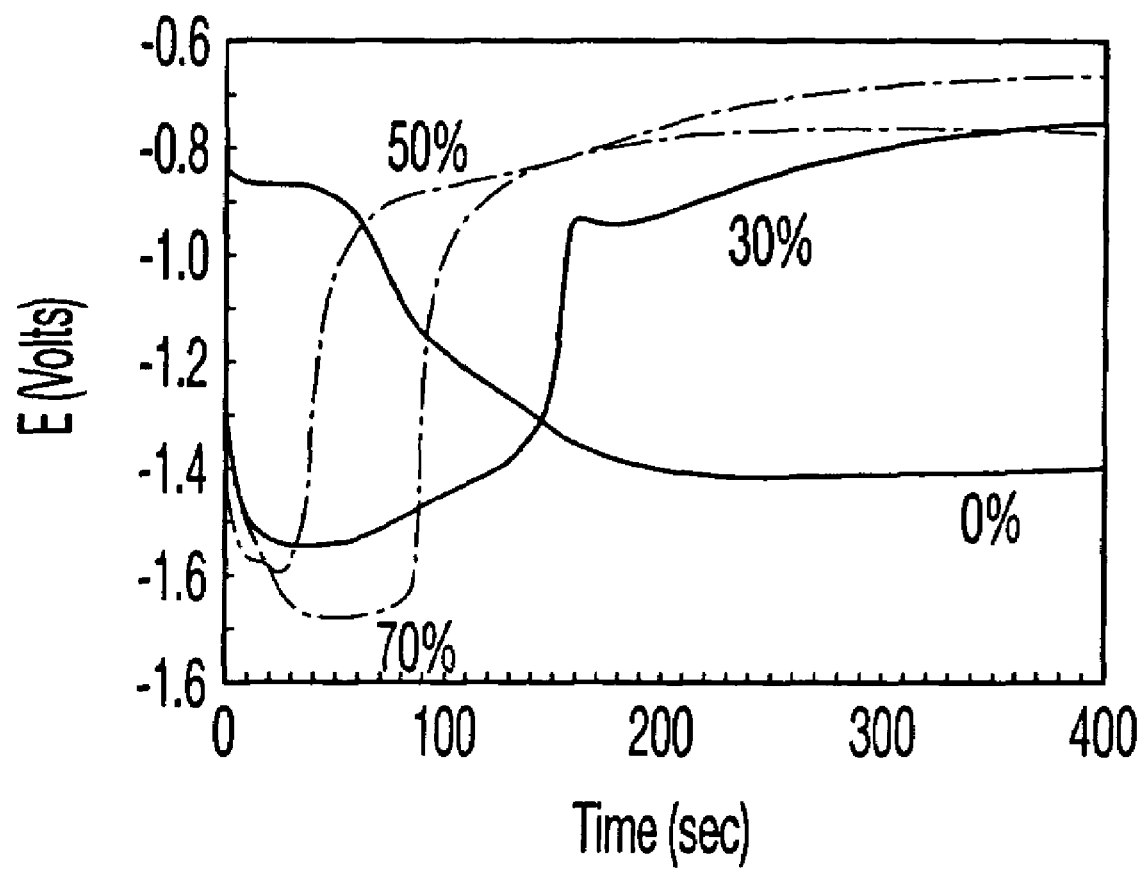
FIG. 9 shows the changes in the OCP of FA as a function of the organic solvent concentrations of 0, 30, 50 and 70 percent for the solvent N,N-dimethylacetamide (DMAC).
Figure 10:
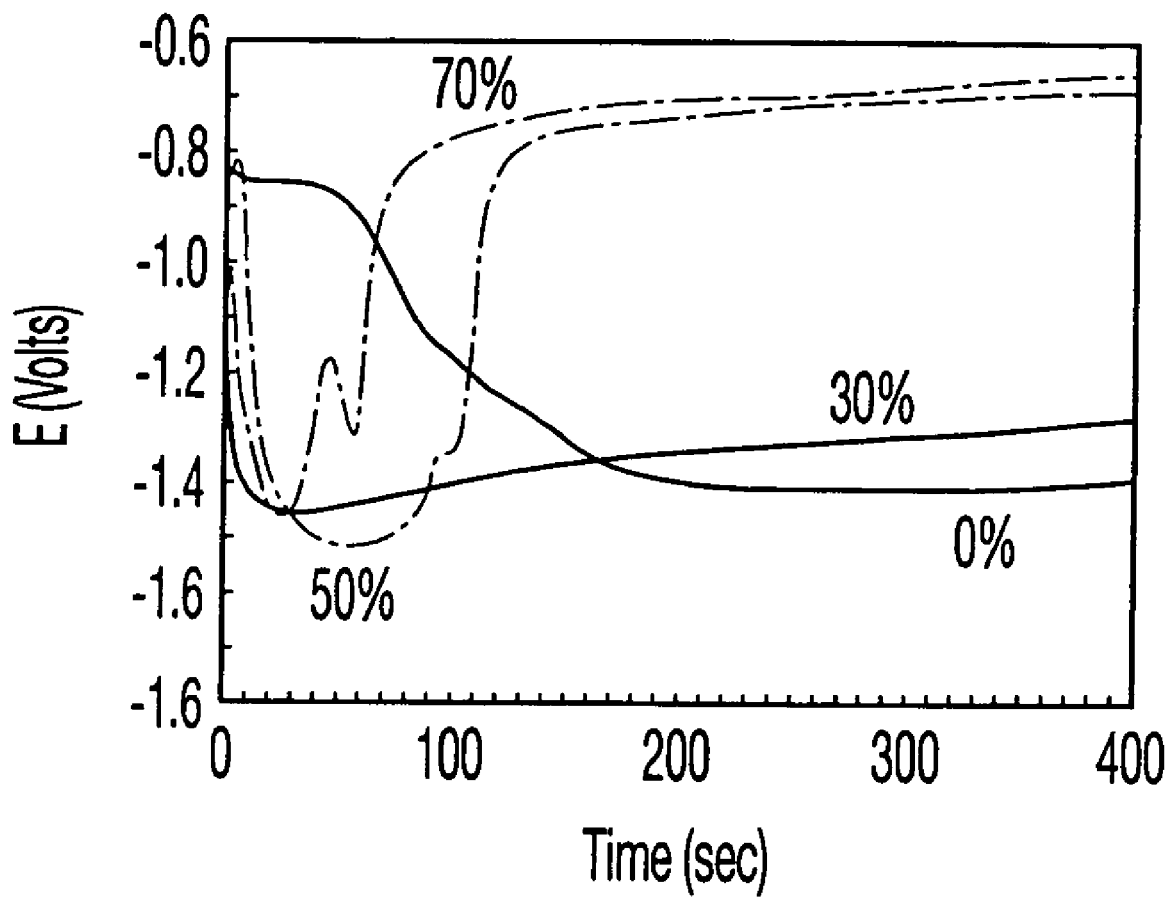
FIG. 10 shows the changes in the OCP of FA as a function of the organic solvent concentrations of 0, 30, 50 and 70 percent for the solvent N-methylpyrolidinone (NMP).
Figure 11:
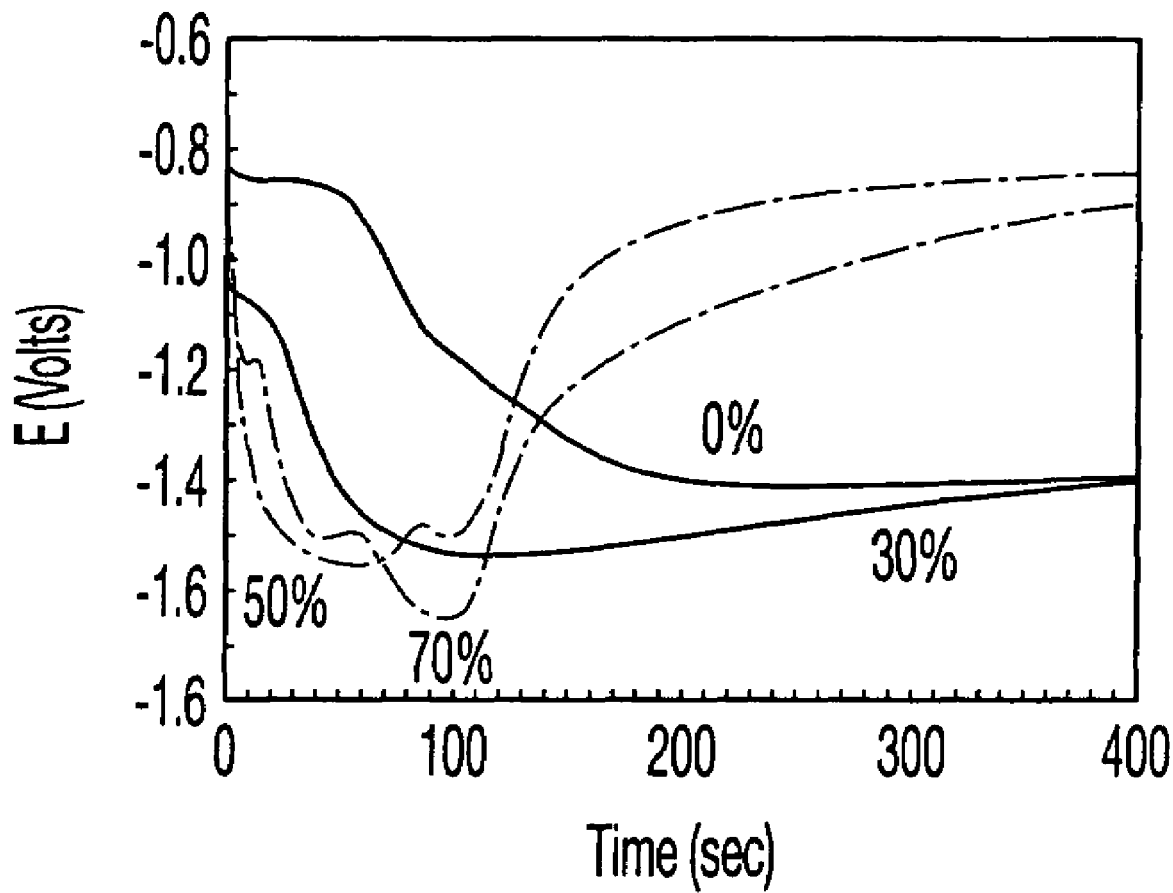
FIG. 11 shows the changes in the OCP of FA as a function of the organic solvent concentrations of 0, 30, 50 and 70 percent for the solvent dimethylsulfoxide (DMSO).

The standard OCP curve for aluminum immersed in remover (FIG. 6) consisted of three separate and distinct functions that can be modeled as a set of sequential chemical reaction equations, namely (1) dissolution of the native oxide, (2) oxidation of aluminum by water and (3) passivation of exposed aluminum metal. This electrochemical process may be treated as a system. In addition, it is clear that some of the reactions in the system were interdependent on other reactions in the set to produce sufficient concentration of critical chemical components in order for the whole process to proceed.

A seven step chemical reaction model of this process is proposed (presented below), based on results of the experimental investigation:

$$NH_4F \leftarrow\rightarrow NH_4^+ + F^- \tag{11}$$

$$Al(OH)_3 + 3F^- \leftarrow\rightarrow AlF_3 + 3OH^- \tag{2}$$

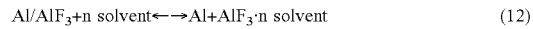

$$Al/AlF_3 + n \text{ solvent} \leftarrow\rightarrow Al + AlF_3 \cdot n \text{ solvent} \tag{12}$$

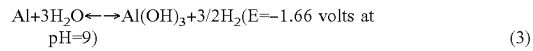

$$Al + 3H_2O \leftarrow\rightarrow Al(OH)_3 + 3/2H_2 (E=-1.66 \text{ volts at pH=9}) \tag{3}$$

$$NH_4^+ + OH^- \leftarrow\rightarrow NH_3 + H_2O \tag{8}$$

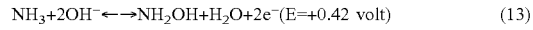

$$NH_3 + 2OH^- \leftarrow\rightarrow NH_2OH + H_2O + 2e^- (E=+0.42 \text{ volt}) \tag{13}$$

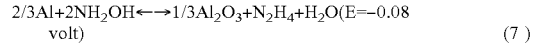

$$2/3Al + 2NH_2OH \leftarrow\rightarrow 1/3Al_2O_3 + N_2H_4 + H_2O (E=-0.08 \text{ volt}) \tag{7}$$

Step (1), dissolution of the native oxide, can be accomplished through equations 11, 2 and 12. Step (2), aluminum reacting with water, is accomplished by means of reaction 3. Aluminum oxidation can provide a driving potential to afford accomplishment of the remaining passivation reactions. Step (3), passivation of exposed aluminum metal, may become accomplished by means of equations 8, 13 and 7. This chemical reaction set has been related to the OCP curve through a theoretical time dependent free energy expression.

Variations in the individual chemical steps are possible and slightly different sets of chemical model reactions may also fit the experimental data. For example, there is insufficient evidence to state whether ammonia becomes oxidized to hydroxylamine, nitrite, or some other final oxidation product. However, it is believed that hydroxylamine is a sufficient oxidizer for aluminum, since it is the first oxidant formed from ammonia and since addition of a small amount of hydroxylamine did passivate aluminum, causing the OCP to drop to less than $-1$ volt.

SAC™ IC remover formulations containing a low concentration of ammonium fluoride have proven effective in cleaning aluminum surfaces of interconnects. This work has shown formation of aluminum fluoride to be associated with the metal surface cleaning process and organic solvents to be associated with removal of surface films and exposure of clean aluminum surfaces. Results of this investigative effort have lead to a modification of formula FA in producing formula FB with a passivating agent resulting in a five-fold reduction in the amount of surface aluminum removed during the cleaning process. Electrochemical OCP measurements indicated the cleaning to proceed in three distinct steps, namely (1) dissolution of the native oxide, (2) oxidation of aluminum by water and (3) passivation of exposed aluminum metal. This electrochemical process was treated as a system and a seven chemical reaction set was proposed to account for the observed process. The experimental data has been explained in terms of this surface removal model. In addition, computations of surface aluminum product concentrations did agree with experimental measurements lending support to the conclusions.

Formulations of the present invention can advantageously be characterized in two categories, e.g., as metal surface fluorinating agents and as metal surface de-fluorinating agents. Metal surface fluorinating agent formulations according to the invention can advantageously include an organic solvent (e.g., a polar organic solvent, such as DMAC, DMSO, or the like, or a combination thereof), water, and a small amount of a non-metallic fluoride salt (e.g., ammonium fluoride; a substituted ammonium fluoride, such as diethylisopropyl-ammonium fluoride; or the like; or a combination thereof).

The present invention includes a process for cleaning residue from an aluminum-containing substrate, which comprises contacting the aluminum-containing substrate with a first composition which removes residue from the substrate and which forms a passivating layer on the substrate, wherein the first composition comprises between about 50% and about 85% water, between about 15% to about 50% organic solvent, and between about 0.01% and about 5% of one or more fluoride compounds, by weight; and contacting the aluminum-containing substrate with a second composition which removes remaining residue from the substrate, wherein the second composition comprises between about 10% and about 50% water, between about 50% and about 85% organic solvent; and between about 0.01% and about 5% of one or more fluoride compounds, by weight, wherein the first composition and the second composition are not the same.

The invention includes a composition that can be used to form a passivating layer over, for example, an aluminum, substrate. In one embodiment, metal surface de-fluorinating agent formulations according to the invention can advantageously include less than about 30% water, alternately not more than about 50% water, for example not more than about 70% water. The metal surface de-fluorinating agent formulations according to the invention may include not less than about 5% water, alternately not less than about 10% water, for example not less than about 15% water. In one embodiment, the metal surface de-fluorinating agent formulations can contain from about 5% to about 70% water. In another embodiment, metal surface de-fluorinating agent formulations according to the invention may contain substantially no water. As used herein, the phrase "contain(s) substantially no," in reference to a composition or to a specific element of a composition, unless otherwise defined, should be understood to mean that the composition contains less than about 2%, preferably less than about 1%, more preferably less than about 0.1%, most preferably less than about 0.01%, of the specific element mention thereafter. Preferably, when the aforementioned phrase is used, the composition is completely free of any added element specifically mentioned thereafter.

In this embodiment, metal surface de-fluorinating agent formulations according to the invention advantageously includes more than about 30% organic solvent, alternately not less than about 50% organic solvent, for example not less than about 70% organic solvent or about 70% to about 95% organic solvent. In another embodiment, metal surface de-fluorinating agent formulations according to the invention may include less than about 95% organic solvent, alternately less than about 85% organic solvent, for example less than about 75% organic solvent.

The invention also includes compositions that can be used to remove a fluoride layer, e.g., an aluminum fluoride layer, from an aluminum substrate. In one embodiment, metal surface fluorinating agent formulations according to the invention can advantageously include not more than about 70% organic solvent, alternately not more than about 50% organic solvent, for example not more than about 30% organic solvent or about 5% to about 30% organic solvent. In another embodiment, metal surface fluorinating agent formulations according to the invention may include not less than about 5% organic solvent, alternately not less than about 10% organic solvent, for example not less than about 15% organic solvent. In another embodiment, metal surface fluorinating agent formulations according to the invention may contain substantially no organic solvent.

In this embodiment, metal surface fluorinating agent formulations according to the invention can advantageously include not less than about 30% water, alternately not less than about 50% water, for example not less than about 70% water. In another embodiment, metal surface fluorinating agent formulations according to the invention may include less than about 95% water, alternately less than about 85% water, for example less than about 75% water.

Optionally but preferably, metal surface fluorinating and/or de-fluorinating agent formulations according to the invention may also contain up to about 20%, preferably up to about 10%, alternately up to about 5%, for example up to about 1%, of a hydroxyl-containing amine compound, e.g., hydroxylamine; hydroxylamine derivatives, such as those having the structural formula:

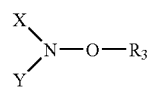

wherein $R_3$ is hydrogen or a linear, branched, or cyclic hydrocarbon containing from 1 to 7 carbon atoms, and wherein X and Y are, independently, hydrogen or a linear, branched, or cyclic hydrocarbon containing from 1 to 7 carbon atoms, or wherein X and Y are linked together form a nitrogen-containing heterocyclic $C_4$-$C_7$ ring; two-carbon atom linkage alkanolamine compounds, such as those having the structural formula,

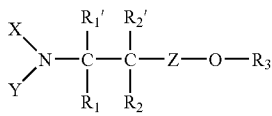

wherein $R_1$, $R_1'$, $R_2$, $R_2'$, and $R_3$ are, independently in each case, hydrogen or a linear, branched, or cyclic hydrocarbon containing from 1 to 7 carbon atoms, wherein Z is a group having the formula $-(-Q-CR_1R_1'-CR_2R_2'-)_m-$, such that m is a whole number from 0 to 3 (i.e, when m=0, there is no atom between the $-CHR_2-$ group and the $-OR_3$ group in the formula above), $R_1$, $R_1'$, $R_2$, and $R_2'$ may be independently defined in each repeat unit, if m>1, within the parameters set forth for these moieties above, and Q may be independently defined in each repeat unit, if m>1, each Q being independently either $-O-$ or $>NR_3$, and wherein X and Y are, independently in each case, hydrogen, a $C_1$-$C_7$ linear, branched, or cyclic hydrocarbon, or a group having the formula $-CHR_1-CHR_2-Z-F$, with F being either $-O-R_3$ or $-NR_3R_4$, where $R_4$ is defined similarly to $R_1$, $R_1'$, $R_2$, $R_2'$, and $R_3$ above, and with Z, $R_1$, $R_1'$, $R_2$, $R_2'$, and $R_3$ defined as above, or wherein X and Y are linked together form a nitrogen-containing heterocyclic $C_4$-$C_7$ ring; or the like; or a combination thereof.

The above described compound may also optionally contain a non-hydroxyl-containing amine compound. Preferably, when present, the hydroxyl-containing amine compound(s) preferably has(have) a boiling point greater than about 190° C. and a flash point of greater than about 95° C., alternately a flash point greater than about 100° C. and/or a boiling point greater than about 200° C. This would include, for example, compounds such as 2-(2-aminoethylamino)-ethanol (AEEA) and 2-(2-hydroxyethylamino)-ethanol (diglycolamine, or DGA).

Also when present, the hydroxyl-containing amine compound(s) is(are) present in an amount (collectively) of at least about 0.01%. In a preferred embodiment, the hydroxyl-containing amine compound(s) is(are) present in amount from about 0.01% to about 1%.

The pH of the metal surface fluorinating and/or defluorinating agent formulations according to the invention may advantageously be adjusted to be basic in nature (i.e., having a pH above 7). In a preferred embodiment, the pH of the formulation is adjusted to be more than 8, alternately from 8 to about 11, for example from about 8.5 to about 10.

EXAMPLES

Examples of cleaning compositions and processes according to the present invention suitable for removing resist mask or residues from a substrate are set forth in examples below.

Example 1 Prior Art

A group of cleaning chemistries containing the ingredients of ammonium fluoride, water, one or more amides, such as N,N-dimethylacetamide, N,N-dimethylformamide, 1-methyl-2-pyrrolidinone, N,N-dimethylpropionamide, and dimethyl sulfoxide listed in Table 1 were tested with metal wafers having stacks of TEOS/Ti/TiN/AlCu/TiN (from Bottom to Top), etched with $Cl_2/BCl_3$ plasma in a commercially available AMT DPS etcher. The resulting metal wafers with residues were cut into small sample pieces, and then the sample pieces were immersed into the chemistry solutions in Table 9 for cleaning for 5 minutes at room temperature. The sample pieces were taken out, rinsed with deionized water, and dried with a flow of $N_2$. SEM was performed with a Hitachi 4500 FE-SEM for evaluating cleaning and corrosion effects. Residue removal and corrosion effects on metal stack were assessed by visual comparisons and were all ranked on a scale of 1 to 10. The formulations in Table 9 are shown in weight percent.

TABLE 9

| Formula | $NH_4F$ | DI Water | DMAC | DMF | DMSO | Time (Mins.) | Metal Lines | | | |
|---|---|---|---|---|---|---|---|---|---|---|
| | | | | | | | Clean | Al | Ti | TiN | Oxide |
| A | 1 | 35 | 64 | | | 5 | 10 | 10 | 10 | 10 | 10 |
| B | 1 | 35 | | 64 | | 5 | 10 | 10 | 10 | 10 | 10 |
| C | 1 | 35 | 32 | 32 | | 5 | 10 | 10 | 10 | 10 | 10 |
| D | 1 | 35 | 32 | | 32 | 5 | 9 | 10 | 10 | 10 | 10 |
| E | 1 | 35 | | 32 | 32 | 5 | 9.5 | 10 | 10 | 10 | 10 |

Reaction Temperature: Room Temperature
DI water: Deionized water
DMAC: N.N-Dimethylacetamide
DMSO: Dimethyl sulfoxide
DMF: N,N-Dimethylformamide
Metal Retention for Metal Lines
Clean lines: 10 - complete, 1 - not clean at all
Al retention: 10 - no change, 1 - Al layer gone
Ti retention: 10 - no change, 1 - Ti layer gone
TiN retention: 10 - no change, 1 - TiN layer gone
Oxide retention: 10 - no change, 1 - Oxide layer gone The results showed that DMF gave the best cleaning performance with no corrosion. However, DMAC and DMSO were chosen for further study based on a consideration of cleaning performance with no corrosion and toxicity considerations.

Example 2 Prior Art

Based on the results in Example 1, N,N-dimethylacetamide and dimethyl sulfoxide were chosen to optimize the cleaning formulations with ammonium fluoride and water. A commercially available LAM TCP9600 etcher with a $Cl_2/BCl_3$ plasma was used for etching metal wafers with a stack of Oxide/Ti/TiN/AlCu/TiN (from bottom to top). The resulting metal wafers with residues were cut into small sample pieces, and the sample pieces were immersed into the cleaning solutions in Table 10 for cleaning for 5 minutes at room temperature. The sample pieces were taken out, rinsed with deionized water, and dried with a flow of $N_2$. SEM was performed with a Hitachi 4500 FE-SEM for evaluating cleaning and corrosion effects. Residue removal and corrosion effects on the metal stack were assessed by visual comparisons and were all ranked on a scale of 1 to 10. pH values, as reported in FIG. 3 of U.S. Pat. No. 6,248,704, were measured with an Orion SA520 meter with glass pH electrode. The formulations in Table 10 are shown in weight percent.

Example 3 Prior Art

One of the compositions (composition N) from Table 10 was chosen to process metal wafers etched with an AMT DPS etcher with $Cl_2/BCl_3$ plasma. After the dry etching process, heavy residues were formed on these metal wafers, as shown in the representative sample of FIG. 4 of U.S. Pat. No. 6,248,704. The metal wafers with the residues were cut into small sample pieces, and the sample pieces were immersed into the chosen chemistry solution for removing the heavy residues for 3, 5 and 10 minutes at room temperature. Composition N could clean the residues completely at 5 minutes and beyond but could not clean the

TABLE 10

| Formula | NH$_4$F | DI water | DMAC | DMSO | Time (Mins.) | Metal Lines | | | |
|---|---|---|---|---|---|---|---|---|---|
| | | | | | | Clean | Al | Ti | TiN | Oxide |
| F (FA) | 1 | 27 | 57 | 15 | 5 | 9.5 | 10 | 10 | 10 | 10 |
| G | 1 | 27 | 67 | 5 | 5 | 9.5 | 10 | 10 | 10 | 10 |
| H | 1 | 27 | 48 | 24 | 5 | 9.5 | 10 | 10 | 10 | 10 |
| I | 1 | 39 | 30 | 30 | 5 | 10 | 10 | 10 | 10 | 10 |
| J | 1 | 79 | 10 | 10 | 5 | 8 | 3 | 10 | 10 | 10 |
| K | 1 | 49 | 40 | 10 | 5 | 9.5 | 9 | 10 | 10 | 10 |
| L | 1 | 59 | 20 | 20 | 5 | 6 | 8 | 10 | 10 | 10 |
| M | 1 | 49 | 10 | 40 | 5 | 8 | 10 | 10 | 10 | 10 |
| N | 1 | 30 | 69 | 0 | 5 | 10 | 10 | 10 | 10 | 10 |
| O | 1 | 29 | 25 | 45 | 5 | 10 | 10 | 10 | 10 | 10 |
| P | 1 | 29 | 35 | 35 | 5 | 10 | 10 | 10 | 10 | 10 |
| Q | 1 | 29 | 45 | 25 | 5 | 9 | 10 | 10 | 10 | 10 |
| R | 1 | 29 | 0 | 70 | 5 | 8 | 10 | 10 | 10 | 10 |

Figure 1C:
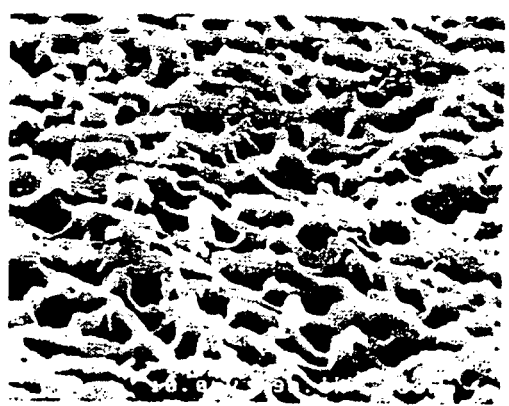
Figure 2A:
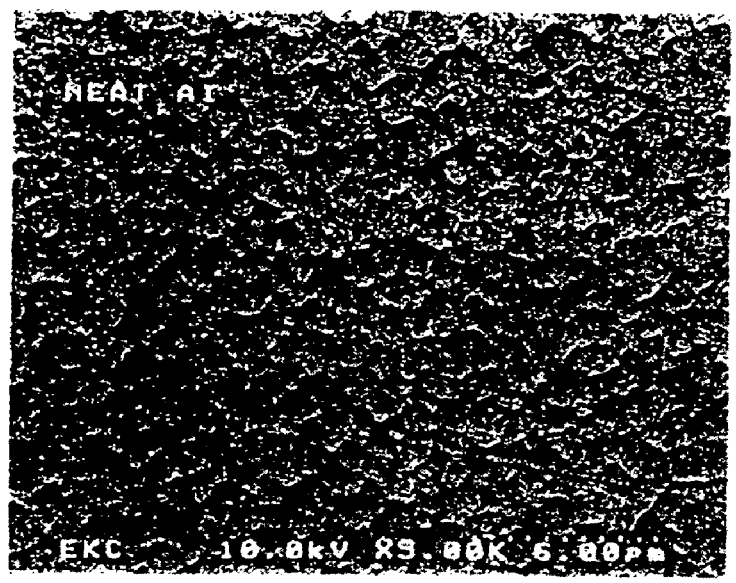
FIGS. 2A-2B show scanning electron microscopy photographs of film surfaces at varying degrees of magnification, showing film surface features before or after exposure to cleaning compositions.
Figure 2B:
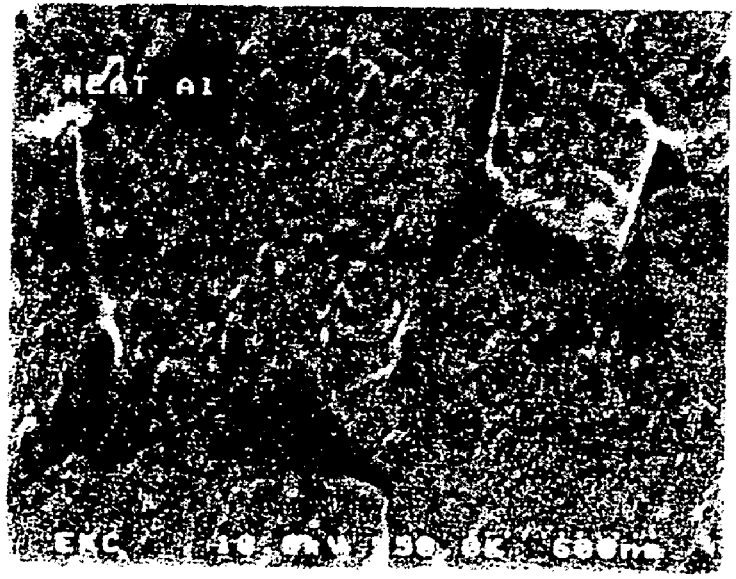

Reaction Temperature: Room Temperature
DI water: Deionized water
DMAC: N,N-Dimethylacetamide
DMSO: Dimethyl sulfoxide
Metal Retention for Metal Lines
Clean lines: 10 - complete, 1 - not clean at all
Al retention: 10 - no change, 1 - Al layer gone
Ti retention: 10 - no change, 1 - Ti layer gone
TiN retention: 10 - no change, 1 - TiN layer gone
Oxide retention: 10 - no change, 1 - Oxide layer gone In order to understand the results obtained with the formulations shown in Table 10, the data was plotted in the three triangle diagrams of FIGS. 1A, 2A, and 3 of U.S. Pat. No. 6,248,704, showing respectively: aluminum corrosion as a function of water, DMAC, and DMSO concentration in the solutions; residue cleaning performance as a function of water, DMAC, and DMSO concentration in the solutions; and pH of the compositions as a function of water, DMAC, and DMSO concentration in the solutions. A comparison of FIG. 1B of U.S. Pat. No. 6,248,704 shows the substantial corrosion with a composition having a high water content and low DMAC and DMSO content. FIG. 1C of U.S. Pat. No. 6,248,704 shows no corrosion with a higher DMAC and DMSO content and lower water content. FIG. 2B of U.S. Pat. No. 6,248,704 shows only partial residue cleaning with a composition having a high water content and low DMAC and DMSO content. FIG. 2C of U.S. Pat. No. 6,248,704 shows complete residue cleaning corrosion with higher DMAC and DMSO content and lower water content. FIG. 3, viewed in combination with FIGS. 1A and 2A, all of U.S. Pat. No. 6,248,704, show the appropriate pH range for avoiding substantial aluminum corrosion and obtaining optimum cleaning results.

residues completely at 3 minutes (FIGS. 5A-5C of U.S. Pat. No. 6,248,704). The sample pieces were then taken out, rinsed with deionized water, and dried with a flow of $N_2$. SEM was performed with a Hitachi 4500 FE-SEM for evaluating cleaning and corrosion effects.

Photo-removal and residue-removal technology will further evolve to meet the needs of 300 mm wafer processing. The SEZ tool and other new types of equipment are becoming more and more popular for large size wafer processing with the focus shift toward individual wafers rather a 25-wafer lot. The large wafer size increases the importance of having a damage-free resist ash process and residue removal process to prevent the loss of increasingly expensive wafers. Furthermore, fast processing procedure for each single wafer will accumulate to save significant time to overall process. In order to cut the processing time, 0.1 weight percent monoethanolamine (MEA) was added to the chosen formulation. The new formulation with MEA can completely clean the residues at 3 minutes, as shown in FIG. 5D of U.S. Pat. No. 6,248,704.

Examples 4 and 5

The surface of an aluminum metal layer (existing either as pure metal or with a thin oxide layer thereon) in Example 4 was predominantly converted to aluminum fluoride upon exposure of the surface to the following formula at room temperature for several minutes: 23.9% DMAC, 75% water; 1% ammonium fluoride, and 0.1% MEA, adjusted to pH of approximately 8.5.

The aluminum fluoride surface layer was removed from the Al layer to leave a clean metal surface in Example 5 upon treatment with the following formula: 73.9% DMAC, 25% water; 1% ammonium fluoride, and 0.1% MEA, adjusted to pH of approximately 8.5.

It is surprising and unexpected that formulations containing a fluoride salt (and optionally a hydroxyl-containing amine compound), such as in Example 5, could nonetheless de-fluorinate a metal surface such as aluminum, especially when similar components, although in different amounts, in a formulation can be used to fluorinate a metal surface such as aluminum under similar conditions.

One skilled in the art will recognize from the foregoing examples that modifications and variations can, and are expected to be made, to the foregoing cleaning solution in accordance with varying conditions inherent in the production process. The embodiments above are given by way of example. For example, the specific discussion of dielectric preservation is indicative of other metal, metal alloy, and polysilicon structures protected by the proposed cleaning solution and method. The teaching examples do not limit the present invention, which is defined by the following claims.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A process for cleaning residue from an aluminum-containing substrate, which comprises:
    contacting the aluminum-containing substrate with a first composition which removes residue from the substrate and which forms a passivating layer on the substrate, wherein the first composition comprises between about 50% and about 85% water, between about 15% to about 50% organic solvent, and between about 0.01% and about 5% of one or more fluoride compounds, by weight; and
    contacting the aluminum-containing substrate with a second composition which removes remaining residue from the substrate, wherein the second composition comprises between about 10% and about 50% water, between about 50% and about 85% organic solvent; and between about 0.01% and about 5% of one or more fluoride compounds, by weight, wherein the first composition and the second composition are not the same.

2. The process of claim 1, wherein the first composition further comprises between about 0.01% and about 2% by weight of an amine.

3. The process of claim 1, wherein the second composition further comprises between about 0.01% and about 2% by weight of an amine.

4. The process of claim 1, in which the second composition comprises from about 0.1% to about 5% by weight of the one or more fluoride compounds and from about 20% to about 50% by weight of the water.

5. The process of claim 1, in which the organic solvents in the first and second compositions each comprise an amide, an organic sulfoxide, or both.

6. The process of claim 1, wherein the passivating layer is a fluorinated metal layer.

7. The process of claim 1, wherein the first composition is organoammonium and amine carboxylate free, has a pH from greater than 8 to about 10, and consists essentially of 23.9% dimethylacetamide, 75% water, 1% ammonium fluoride, and 0.1% monoethanolamine, by weight.

8. The process of claim 1, wherein the second composition is organoammonium and amine carboxylate free, has a pH from greater than 8 to about 10, and consists essentially of 73.9% dimethylacetamide, 25% water, 1% ammonium fluoride, and 0.1% monoethanolamine, by weight.

9. The process of claim 1, wherein the substrate comprises a semiconductor wafer.

10. The process of claim 1, wherein the substrate comprises a thin film display.

11. The process of claim 1, wherein the substrate comprises an advanced memory device.

12. The process of claim 1, wherein the substrate comprises a hard disk data storage device.

13. The process of claim 1, wherein the substrate comprises an inkjet printer cartridge head.

14. The process of claim 7, wherein the second composition is organoammonium and amine carboxylate free, has a pH from greater than 8 to about 10, and consists essentially of 73.9% dimethylacetamide, 25% water, 1% ammonium fluoride, and 0.1% monoethanolamine, by weight.

* * * * *